(12) United States Patent
Pahlevaninezhad et al.

(10) Patent No.: US 11,062,628 B2
(45) Date of Patent: Jul. 13, 2021

(54) APPARATUS HAVING A FLEXIBLE LED DISPLAY MODULE AND A METHOD OF EMPLOYING SAME

(71) Applicant: 10644137 CANADA INC., Calgary (CA)

(72) Inventors: Majid Pahlevaninezhad, Calgary (CA); Sam Scherwitz, Calgary (CA); Iman Askarianabyaneh, Calgary (CA); Shekari Dawood Beyragh, Calgary (CA)

(73) Assignee: 10644137 CANADA INC., Calgary (CA)

( * ) Notice: Subject to any disclaimer, the term of this patent is extended or adjusted under 35 U.S.C. 154(b) by 109 days.

(21) Appl. No.: 16/496,334

(22) PCT Filed: Mar. 22, 2018

(86) PCT No.: PCT/CA2018/050347
§ 371 (c)(1),
(2) Date: Sep. 20, 2019

(87) PCT Pub. No.: WO2018/170599
PCT Pub. Date: Sep. 27, 2018

(65) Prior Publication Data
US 2020/0035134 A1    Jan. 30, 2020

Related U.S. Application Data

(60) Provisional application No. 62/475,055, filed on Mar. 22, 2017.

(51) Int. Cl.
*G09F 9/33* (2006.01)
*H01R 13/62* (2006.01)
(Continued)

(52) U.S. Cl.
CPC ............... *G09F 9/33* (2013.01); *H01R 12/77* (2013.01); *H01R 13/6205* (2013.01); *G06F 3/1446* (2013.01)

(58) Field of Classification Search
CPC .......... G09F 9/33; G09F 9/3026; G09F 9/301; H01R 13/6205; H01R 12/77;
(Continued)

(56) References Cited

U.S. PATENT DOCUMENTS 9,410,683 B2   8/2016   Tischler et al.
9,477,438 B1   10/2016  Hochman et al.
(Continued)

FOREIGN PATENT DOCUMENTS

WO   2016110483 A1   7/2016

OTHER PUBLICATIONS

International Search Report and Written Opinion issued in PCT/CA2018/050347, dated Jun. 18, 2018. (11 pages).

*Primary Examiner* — Joseph L Williams
*Assistant Examiner* — Jose M Diaz
(74) *Attorney, Agent, or Firm* — Chamberlain, Hrdlicka, White, Williams & Aughtry

(57) ABSTRACT

A Light-Emitting Diode (LED) apparatus has one or more LED display modules. At least one of the one or more LED display modules has a plurality of LED display submodules. The plurality of LED display submodules are flexibly coupled to each other to form a flexible display surface.

21 Claims, 24 Drawing Sheets

(51) Int. Cl.
*H01R 12/77* (2011.01)
*G06F 3/14* (2006.01)

(58) Field of Classification Search
CPC ... G06F 3/1446; H01L 33/62; H01L 25/0753; G09G 3/14; F21S 4/22; F21S 4/24; F21S 4/26; F21Y 2107/10; F21Y 2107/50; F21Y 2107/70
USPC .......................... 362/249.04, 249.08; 345/46
See application file for complete search history.

(56) References Cited

U.S. PATENT DOCUMENTS

| | | | |
|---|---|---|---|
| 9,640,516 B2 * | 5/2017 | Cope | G06F 3/1446 |
| 2016/0125772 A1 | 5/2016 | Li et al. | |
| 2017/0351475 A1 * | 12/2017 | Meersman | G09G 3/32 |
| 2018/0373293 A1 * | 12/2018 | Staton | G06F 1/1605 |
| 2020/0161287 A1 * | 5/2020 | Yoo | G09F 9/301 |

* cited by examiner

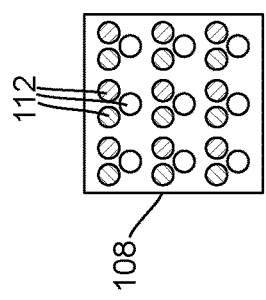
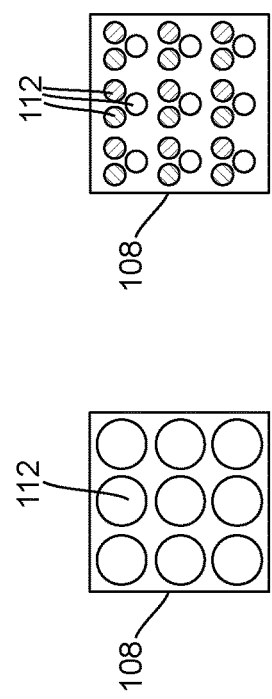
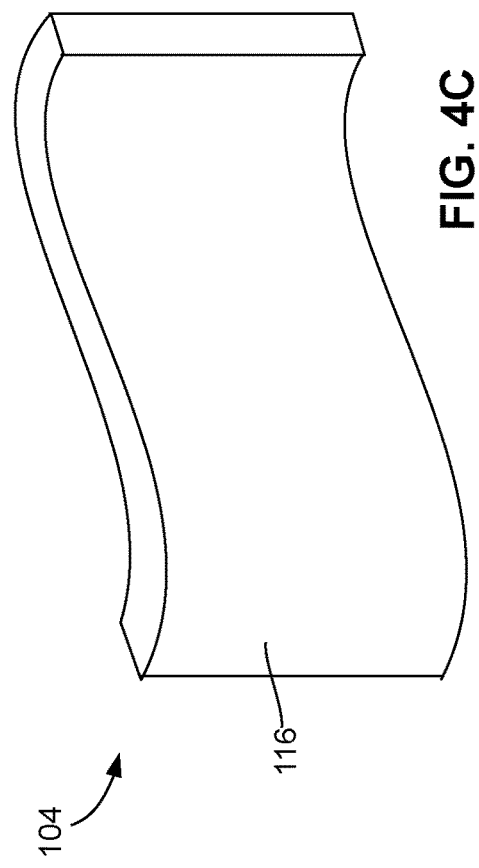
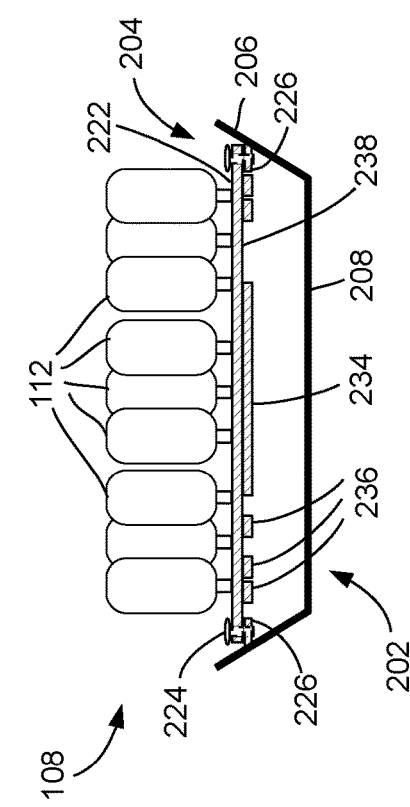
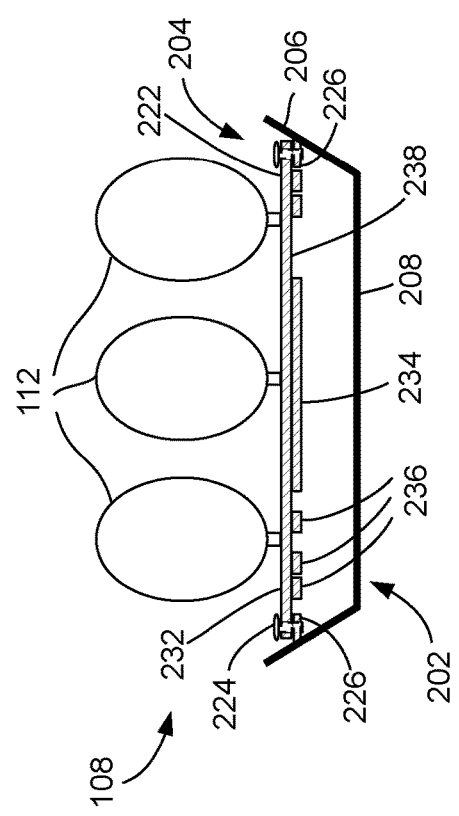

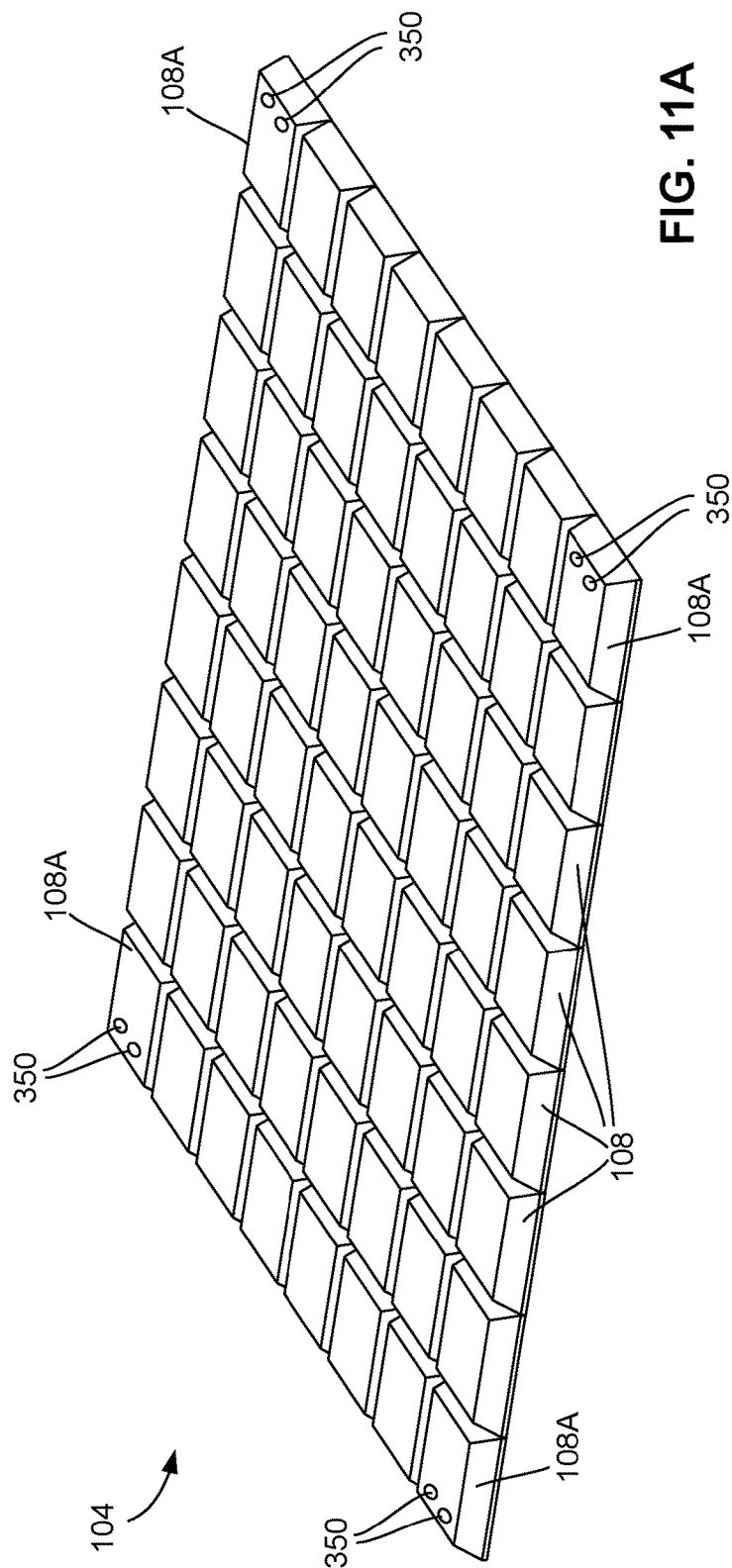
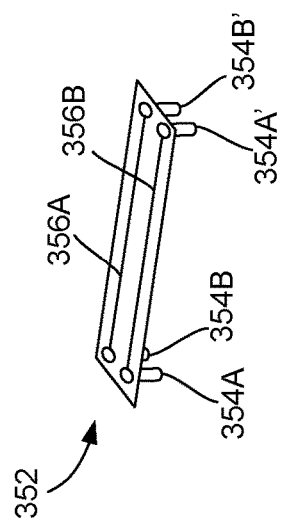
FIG. 11A
FIG. 11B

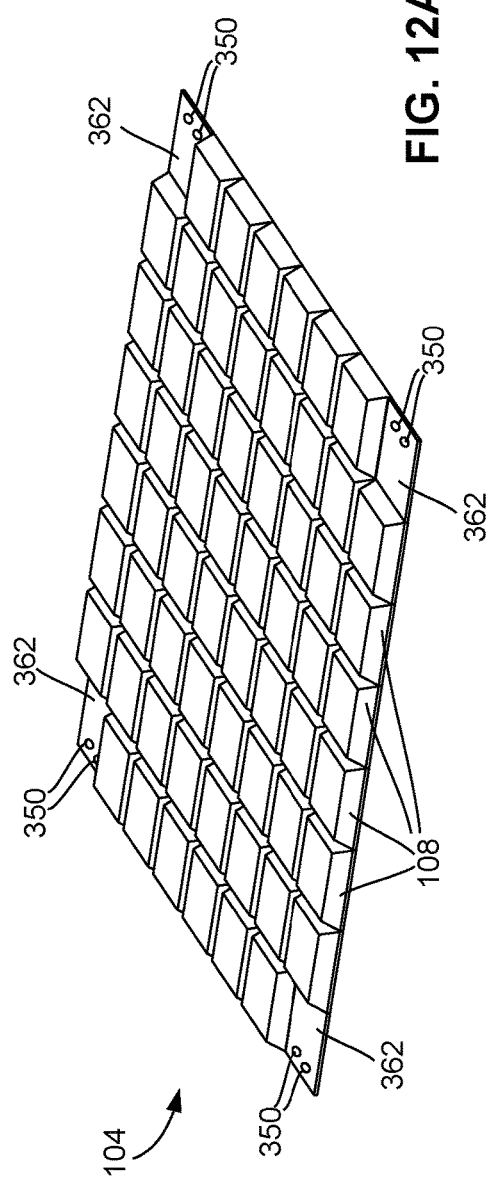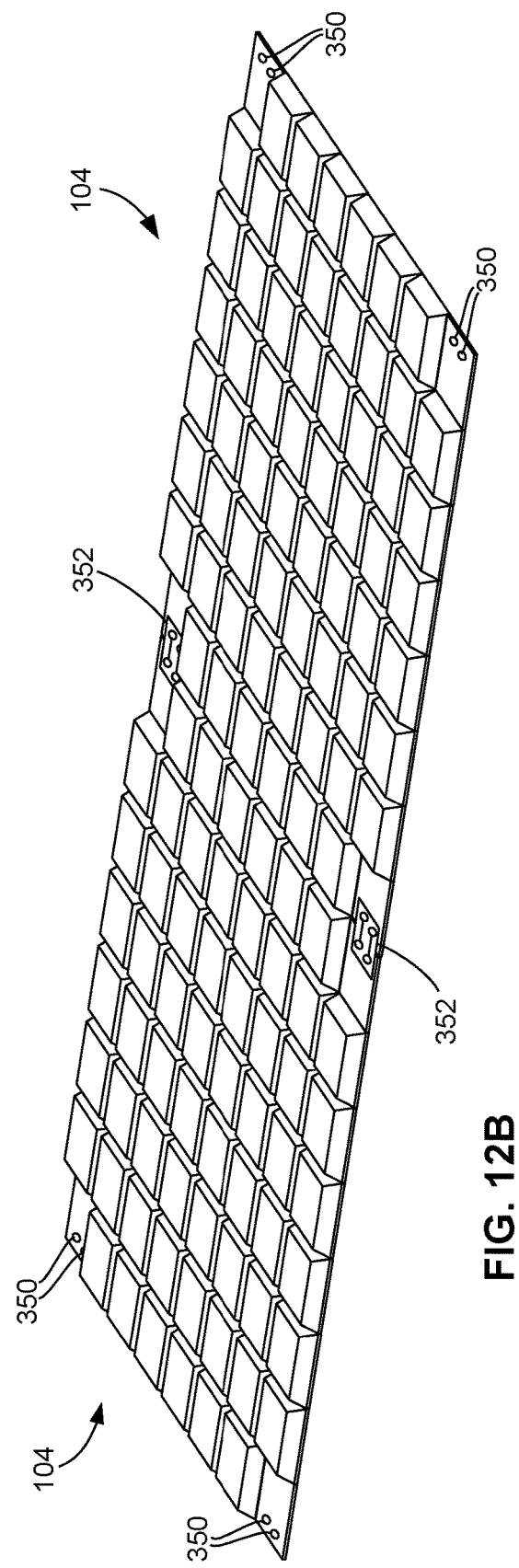

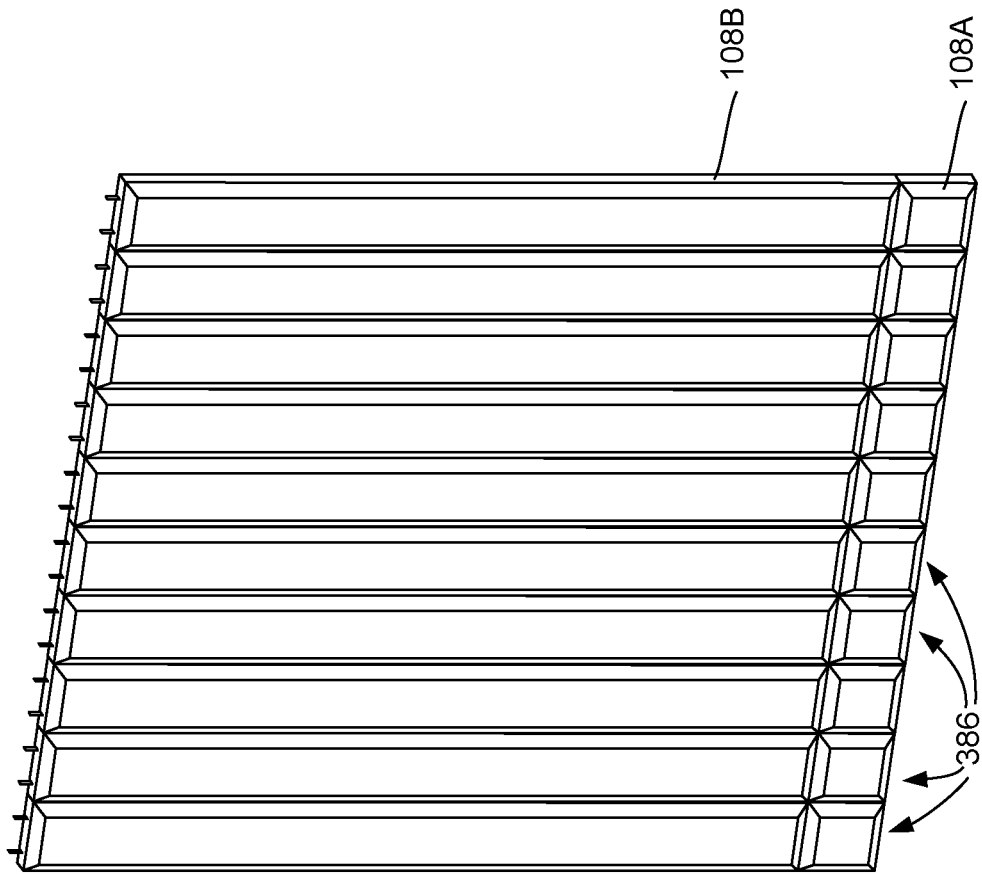
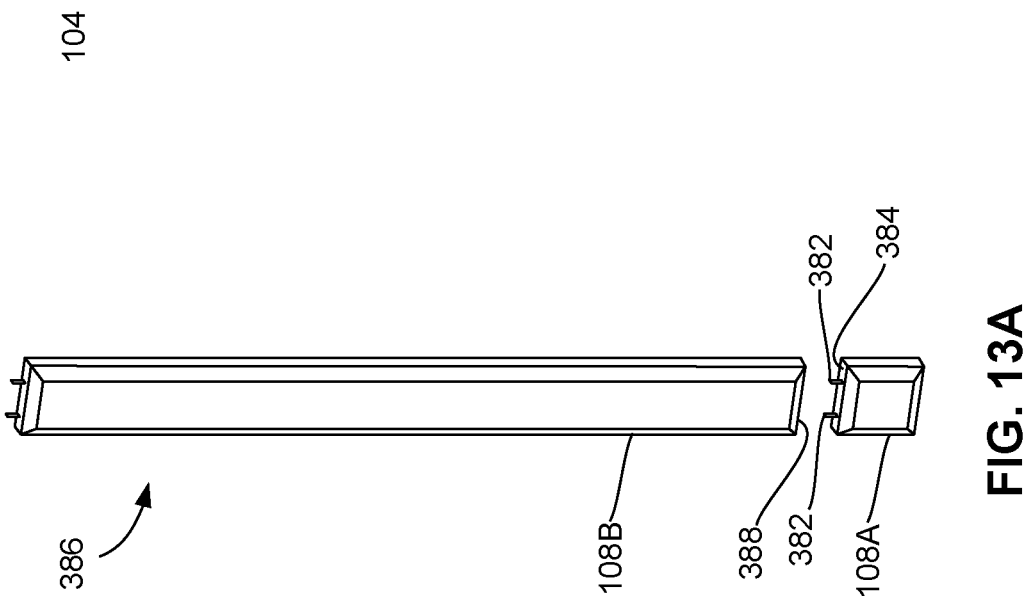
FIG. 13A
FIG. 13B

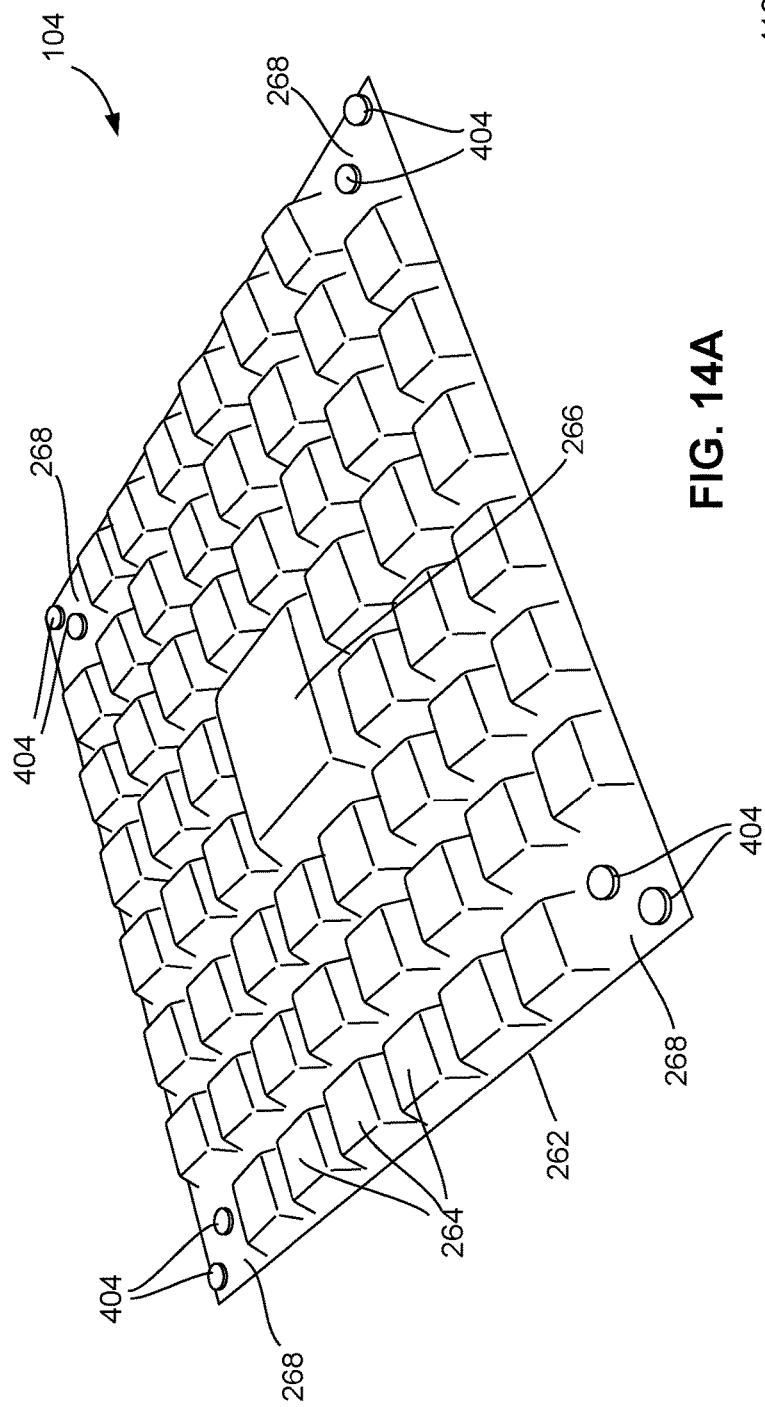
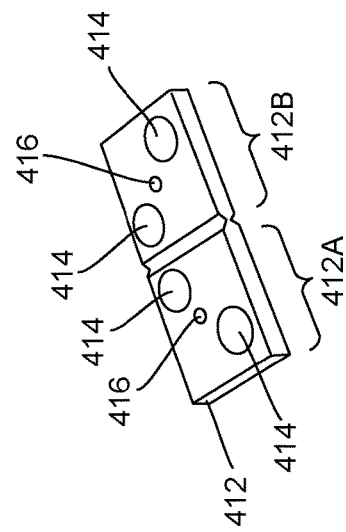
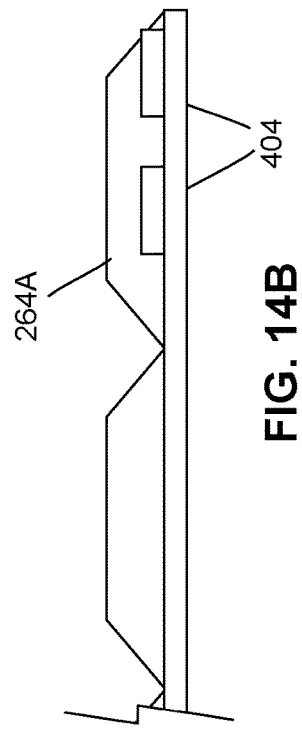
FIG. 14A
FIG. 14B
FIG. 14C

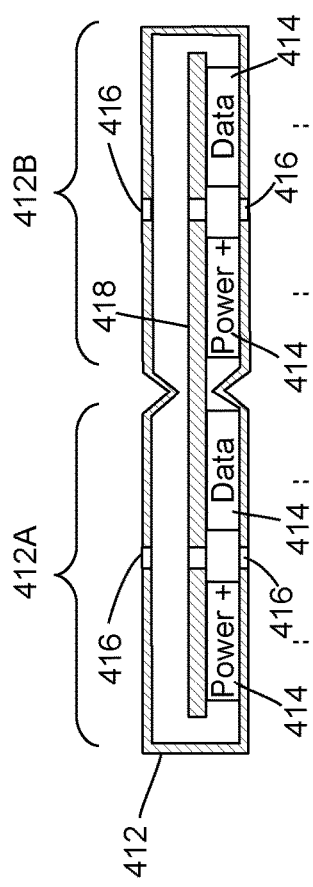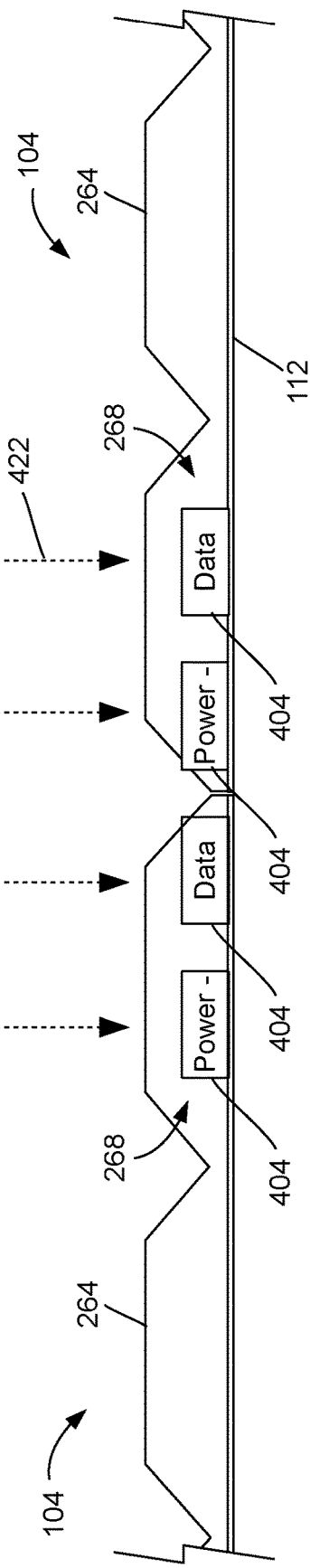

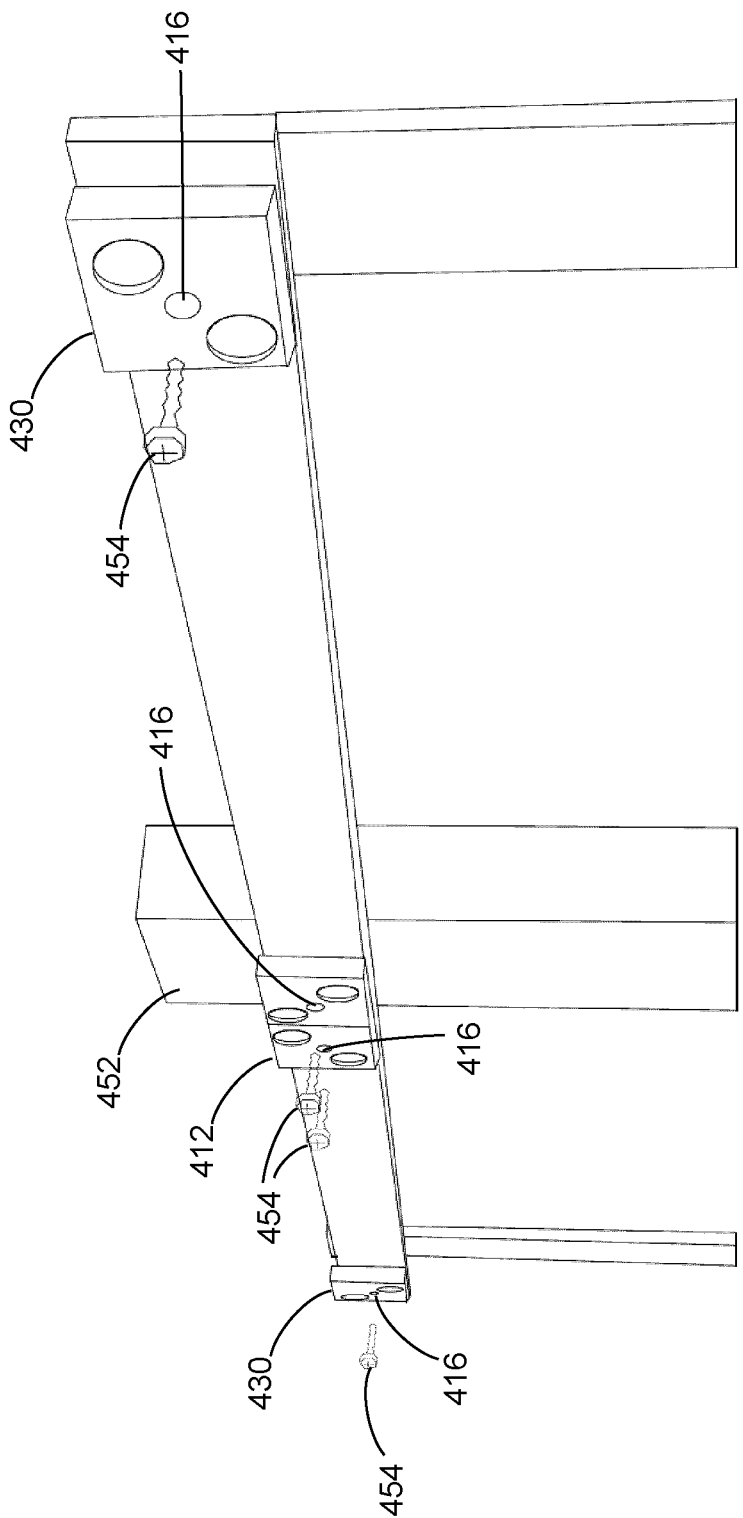

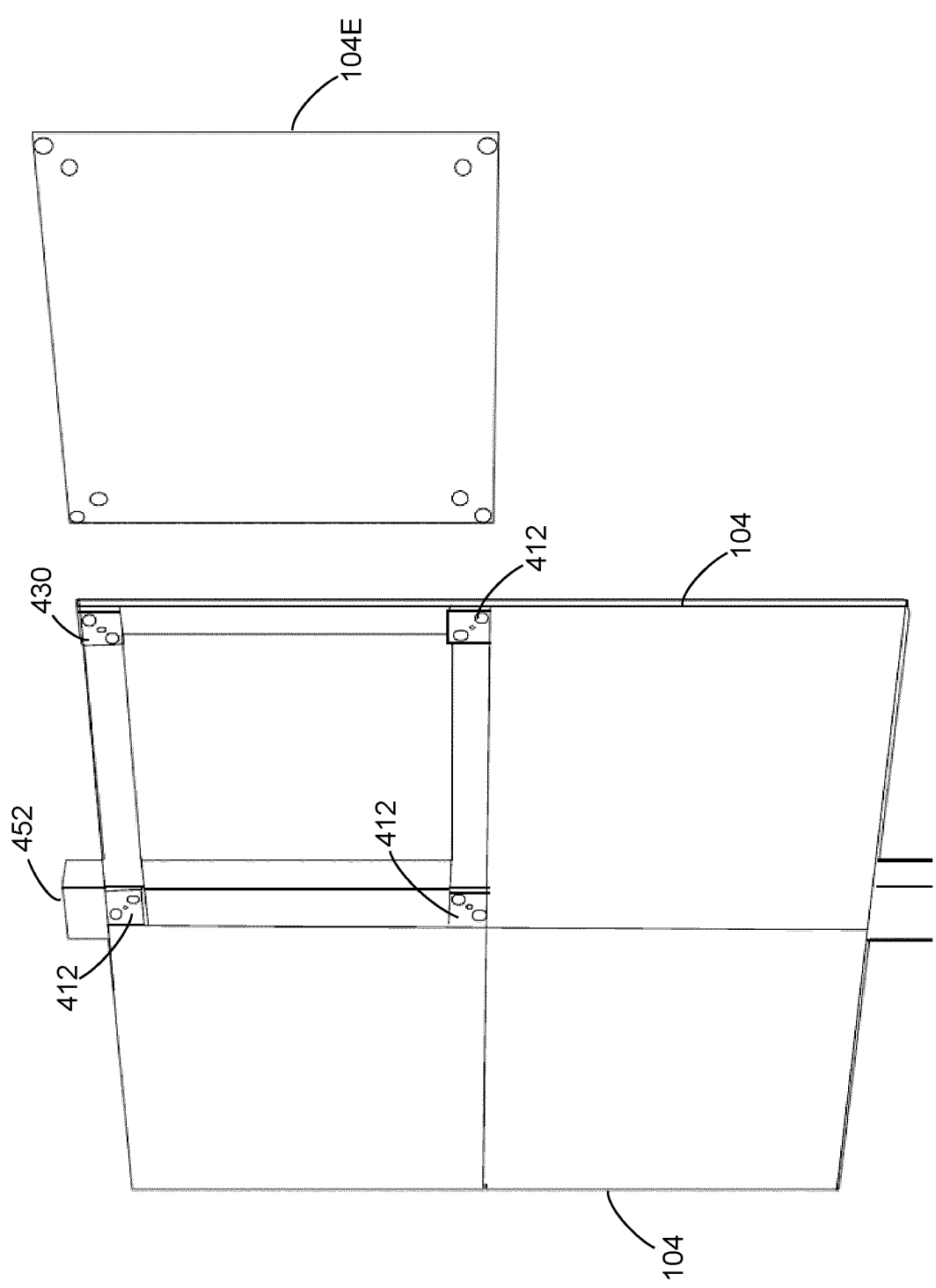

US 11,062,628 B2

APPARATUS HAVING A FLEXIBLE LED DISPLAY MODULE AND A METHOD OF EMPLOYING SAME

CROSS-REFERENCE TO RELATED APPLICATIONS

This application claims the benefit of U.S. Provisional Patent Application Ser. No. 62/475,055 filed Mar. 22, 2017, the content of which is incorporated herein by reference in its entirety.

FIELD OF THE DISCLOSURE

The present disclosure relates to Light-Emitting Diode (LED) apparatuses and systems, and in particular to apparatuses and systems with flexible LED display modules, and methods of employing same.

BACKGROUND

Light-Emitting Diodes (LEDs) are known and have been widely used in industries, mostly as low-power light indicators. In recent years, LEDs with increased power output or increased luminous intensity have been developed and used for illumination. LED lights provide improved energy efficiency, safety, and reliability, and are replacing other types of lights in the market such as incandescent lights, Compact Fluorescent Lamps (CFLs), and the like. As everyday lighting significantly contributes to the burden on power grids and greatly increases the overall requirements for electricity generation, the energy efficiency of LEDs will play a crucial role in future energy savings. It is likely that LEDs will dominate the lighting markets because of their superior energy efficiency.

LEDs with increased power output or increased luminous intensity have also been used for image/video displays, such as digital signage and the like. Digital LED signage is a fast-growing industry due to the increasing demand for marketing, advertising, and the like.

Prior-art digital LED signage displays utilize separate power conversion units along with LED drivers to provide electrical power to the LEDs from an external power source such as a power grid. While external power sources usually output alternate-current (AC) power, LEDs generally require direct-current (DC) power. Consequently, the power conversion unit of a digital LED signage usually comprises both an AC-to-DC (AC/DC) converter and a DC-to-DC (DC/DC) converter to convert the AC input power from the external power source into DC power suitable for LEDs.

The LED drivers regulate the power delivered to the LEDs, thereby controlling the display (for example, off, on, lighting intensity, color, and the like) of each LED. The LED drivers are wire-harnessed to a central controller for receiving control signals therefrom for regulating the LEDs.

The above-described components, such as power converters, LED drivers, the central controller, and LEDs, usually require a large space such as a large cabinet for accommodation. Moreover, they usually produce significant amounts of heat, and thus need suitable cooling means such as fans or large heat-sinks, for heat dissipation. A well-designed thermal management system is essential to a power conversion unit for LEDs.

FIG. 1 shows an example of a prior-art LED signage display 10. As shown, the LED signage display 10 comprises one or more LED display modules 12 having a plurality of LEDs for display, and a cabinet 14 for accommodating various electrical components of the LED signage display 10 such a power converter, a central controller, and the like. The LED display modules 12 are connected to the electrical components in the cabinet 14 via one or more cables (not shown). In this example, the LED display module 12 is physically coupled to the cabinet 14. However, those skilled in the art will appreciate that, in some prior-art LED signage displays 10, the LED display modules 12 may be physically separated from the cabinet 14.

FIG. 2A is a schematic diagram of the commonly available LED signage 10. As shown, the LED display module 12 of the LED signage 10 is electrically connected to a power converter 18 and a central controller 20 in the cabinet 14 via one or more cables 16A and 16B. In other words, the power converter 18 and a central controller 20 are physically separated from the LED display module 12 and are electrically connected thereto via the cables 16A and 16B.

The LED display module 12 comprises one or more LED drivers 22 driving a plurality of LEDs 24 which are usually arranged in a matrix form having one or more rows and one or more columns. Each LED 24 may be a single-color LED that only emits a single-color light such as a red, green, or blue light, or a multi-color LED such as a tri-color LED that can selectively emit multiple colored lights such as red, green, and blue lights. If single-color LEDs are used, the single-color LEDs may be grouped into one or more LED sets with each LED set comprising a red, green, and blue LEDs arranged in proximity with each other, thereby forming a pixel of the LED display module 12. On the other hand, if tri-color LEDs are used, each tri-color LED forms a pixel of the LED display module 12.

The LED drivers 22 receive electrical power from the power converter 18 via one or more power wires or cables 16A for powering the LEDs 24. The LED drivers 22 also receive control signals from the central controller 20 via one or more signal wires or cables 16B for regulating the power delivered to the LEDs 24, thereby controlling the lighting of each LED 24 (for example, off, on, lighting intensity, color, and/or the like) for controlling the display of the LED signage 10. Depending on the driving capacity of the LED drivers 22, each LED driver 22 may be electrically connected to and regulate a subset of the LEDs 24 for example, 4, 8, or 16 LEDs 24.

As described before, the power converter 18 is located in the cabinet 14, physically separated from the LED display module 14 but electrically connected thereto via the electrical wires 16A and 16B usually in the form of one or more cables. The power converter 18 comprises an AC/DC converter 26 and a DC/DC converter 28. The AC/DC converter 26 converts the AC electrical power from an external power source 30 into high-voltage DC power and outputs the converted high-voltage DC power to the DC/DC converter 28. The DC/DC converter 28 converts the high-voltage DC power received from the AC/DC converter 26 into low-voltage DC power (for example, at about 5V, 7.5V, or the like) suitable for powering the LEDs 24 in the LED display module 12, and outputs the low-voltage DC power to the LED display module 12 via the cable 16A. Therefore, existing LED signage displays 10 have a low-voltage power distribution (for example, 5V) to their LED display modules 12.

Also referring to FIG. 2B, each LED display module 12 (and in particular the LED drivers 22 therein) is electrically connected to the central controller 20 via the cable 16B such as a ribbon cable. The central controller 20 is functionally connected to one or more computing devices 32 (see FIG. 2A) such as a desktop computer, a laptop computer, a smartphone, a tablet, a personal digital assistant (PDA), and the like, via suitable wired or wireless connection for receiving instructions therefrom. In response to the received instructions, the central controller 20 sends control signals to the LED drivers 22 to regulates the power delivered to the LEDs 24 of the LED display module 12, thereby controlling the display (for example, off, on, the lighting intensity, color, and the like) of each LED 24 thereof for controlling the display of the LED signage 10.

There are several challenges and difficulties related to the prior-art digital LED signage displays. For example, due to the fact that a low DC voltage is distributed from the power converter 18 to the LED display module 12, the electrical current in the power cable 16A (see FIG. 2A) and in other wiring of the LED signage display 10 is significantly large (as the power consumption of the LED signage display 10 is constant), thereby causing substantial amounts of energy losses in the form of heat. Therefore, a prior-art digital LED signage display usually requires multiple fans and/or large heat-sinks for heat dissipation, and consequently requires an effective thermal management system. The large amount of generated heat is also a risk to safety and reliable operation of digital LED signage displays.

Moreover, using fans or rotational parts for the digital LED signage display significantly reduces its reliability since the rotational parts are usually the points of failure in these products.

As each LED driver 22 is connected to the central controller 20 via the cable 16B (for example a ribbon cable), a large digital LED signage display 10 generally requires one or more ribbon cables 16B having a large number of wires therein, which makes the digital LED signage display 10 expensive and unreliable since there is a high risk that the wires in ribbon cables may get disconnected and/or damaged over time, particularly in outdoor applications. Moreover, these ribbon cables are usually points of failure for digital LED signage displays.

As all above-described components are received in the cabinet 14, a prior-art LED signage display is usually bulky and heavy, and therefore, difficult to install and handle. Lifting or crane equipment is often required for installation of a prior-art LED signage display.

SUMMARY

The embodiments of the present disclosure relate to a Light-Emitting Diode (LED) display module. The LED display module comprises a plurality of LED display submodules. Each LED display submodule comprises one or more LEDs, and the plurality of LED display submodules are flexibly coupled to each other to form a flexible display surface.

In some embodiments, each LED display submodule may comprise an enclosure in a frustum shape.

In some embodiments, each LED display submodule may comprise 9 LEDs arranged in a 3-by-3 matrix.

In some embodiments, each LED display submodule may be flexibly coupled to one or more neighboring LED display submodules via a flexible coupling structure.

In some embodiments, the flexible coupling structure comprises a hinge.

In some embodiments, the LED display module further comprises a plurality of flexible electrical-connectors for interconnecting the plurality of LED display submodules.

In some embodiments, at least one of the plurality of flexible electrical-connectors is removably connectable to two of the plurality of LED display submodules.

In some embodiments, at least two of the plurality of LED display submodules may comprise a first electrically-conductive coupling structure. At least one of the plurality of flexible electrical-connectors comprises a second electrically-conductive coupling structure for electrically and mechanically engaging the first electrically-conductive coupling structure.

In some embodiments, the first electrically-conductive coupling structure may comprise a set of electrically-conductive recesses. The second electrically-conductive coupling structure may comprise at least two sets of electrically-conductive extrusions, wherein each set of extrusions is electrically and mechanically engageable with the set of electrically-conductive recesses.

In some embodiments, the set of electrically-conductive recesses and the set of electrically-conductive extrusions may comprise magnets with opposite poles.

In some embodiments, at least one of the plurality of flexible electrical-connectors may comprise two halves flexibly coupled together, wherein the two halves are made of a rigid material.

In some embodiments, the at least one of the plurality of flexible electrical-connectors may comprise at least one screw hole on each of the two halves for mounting the flexible electrical-connector to a surface.

In some embodiments, at least one of the plurality of flexible electrical-connectors may comprise a mounting structure for mounting the flexible electrical-connector to a surface.

In some embodiments, the mounting structure may comprise at least two screw holes.

In some embodiments, the LED display module may further comprise at least one rigid attachment structure for attaching the LED display module to a surface.

In some embodiments, at least one of the plurality of flexible electrical-connectors may comprise a flexible Printed Circuit Board (PCB).

In some embodiments, at least one of the plurality of flexible electrical-connectors is a flexible and electrically conductive strip.

In some embodiments, the LED display module further may comprise a flexible housing structure, wherein the flexible housing structure comprises a plurality of cells for receiving the plurality of LED display submodules. The plurality of flexible electrical conductors may be embedded in the flexible housing structure.

In some embodiments, each cell may comprise a plurality of electrical terminals connected to the plurality of flexible electrical conductors and configured for electrically connection with the LED display submodule received in the cell.

In some embodiments, the plurality of electrical terminals of each cell may comprise at least a first set of electrical terminals for transmitting electrical power.

In some embodiments, the plurality of electrical terminals of each cell further may comprise at least a second set of electrical terminals for transmitting data or control signals.

In some embodiments, the plurality of LED display submodules have a same size.

In some embodiments, at least some of the plurality of LED display submodules have different sizes.

According to one aspect of this disclosure, there is disclosed a LED apparatus comprising one or more LED display modules as described above.

According to one aspect of this disclosure, there is disclosed a LED apparatus. The LED apparatus comprises: one or more LED display modules, each LED display module comprising at least one first coupling structure and a plurality of LEDs; and one or more set of attachment structures for attaching the one or more LED display modules to a surface, each attachment structure comprising at least one second coupling structure for engaging the first coupling structure. The first and second coupling structures comprise magnets with opposite poles.

In some embodiments, each of the one or more set of attachment structures may comprise a mounting structure for mounting the attachment structure to a surface.

In some embodiments, the mounting structure may comprise at least one screw hole.

In some embodiments, the at least one first coupling structure of each LED display module may comprise four first coupling structures located at four corners of the LED display module.

In some embodiments, the one or more LED display modules may comprise a plurality of LED display modules arranged in a matrix manner. The one or more set of attachment structures may comprise at least one first attachment structure configured for coupling two neighboring LED display modules and for attaching the two neighboring LED display modules to a surface.

In some embodiments, each first attachment structure may comprise two halves flexibly coupled together; wherein each half is made of a rigid material and comprises one of the second coupling structures.

In some embodiments, the second coupling structure of each half of the first attachment structure may comprise at least one magnet with a pole opposite to that of the magnets of the first coupling structure.

In some embodiments, the first attachment structure is configured for electrically connecting the two neighboring LED display modules.

In some embodiments, the first attachment structure comprises a flexible PCB.

In some embodiments, the first attachment structure may comprise a plurality of first electrical terminals for electrically connecting the two neighboring LED display modules.

In some embodiments, the plurality of first electrical terminals may comprise at least a first set of first electrical terminals for transmitting electrical power.

In some embodiments, the plurality of first electrical terminals of each cell may further comprise at least a second set of first electrical terminals for transmitting data or control signals.

In some embodiments, each LED display module may comprise a flexible housing structure; and the flexible housing structure comprises: a plurality of cells for receiving a plurality of LED display submodules, each LED display submodule comprising a portion of the plurality of LEDs, and a plurality of flexible electrical conductors embedded in the flexible housing structure.

In some embodiments, each cell may comprise a plurality of second electrical terminals connected to the plurality of flexible electrical conductors and configured for electrically connection with the LED display submodule received in the cell.

In some embodiments, the plurality of electrical terminals of each cell may comprise at least a first set of second electrical terminals for transmitting electrical power.

In some embodiments, the plurality of electrical terminals of each cell may further comprise at least a second set of second electrical terminals for transmitting data or control signals.

In some embodiments, the plurality of LED display submodules have a same size.

In some embodiments, at least some of the plurality of LED display submodules have different sizes.

BRIEF DESCRIPTION OF THE DRAWINGS

The embodiments of the present disclosure will now be described with reference to the following figures, in which identical reference numerals in different figures indicate identical elements and in which:

FIG. 4C is a schematic perspective view of an LED display module shown in FIG. 3, showing the front side thereof;

FIG. 5A is a front view of an LED display submodule shown in FIG. 4A, the LED display submodule comprising nine (9) tri-color LEDs;

FIG. 5B is a front view of an LED display submodule shown in FIG. 4A, the LED display submodule comprising nine (9) sets of LEDs, each set comprising three single-color LEDs (Red, Green and Blue), and forming a pixel of the LED display submodule;

FIG. 6A is a cross-sectional view of an LED display submodule having a plurality of multi-color LEDs;

FIG. 6B is a cross-sectional view of the LED display submodule shown in FIG. 6A;

FIGS. 11A to 11C show a method for connecting LED display modules in some alternative embodiments;

FIG. 12A is a schematic perspective view of an LED display module shown in FIG. 3, according to some alternative embodiments;

FIG. 12B shows two LED display modules shown in FIG. 12A electrically and physically connected using a connector strip;

FIG. 13A shows another connection method in some alternative embodiments;

FIG. 13B shows an LED display module having a plurality of electrically connected submodules shown in FIG. 13A;

FIGS. 14A to 14F show an LED display module having one or more dual-attachment plates, according to some alternative embodiments;

FIG. 15 show a single-attachment plate for attaching to an LED display module, according to some alternative embodiments;

FIGS. 17A to 17E show four LED display modules being electrically interconnected and mounted onto a display stand;

FIGS. 18A and 18B show an example of quick replacement of a malfunctioning LED display module by removing the malfunctioning LED display module from a display stand, and then attaching a replacement LED display module thereonto.

DETAILED DESCRIPTION

The present disclosure generally relates to a LED display apparatus. In some embodiments, the LED display apparatus is a modularized apparatus with a light weight and a slim profile. In some embodiments, the LED display apparatus comprises one or more flexible LED display modules. The LED display apparatus disclosed herein has many advantages including among others, a slim mechanical structure, no need for multiple cabling to connect each LED display module to a central controller, light weight, compact, high efficiency, and simple heat removal with no rotational components such as fans.

Figure 1:
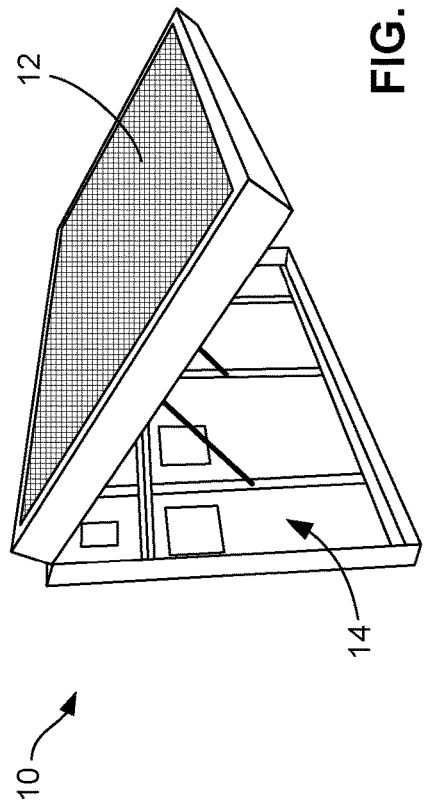
FIG. 1 is a side view of a prior-art LED signage display.
Figure 2A:
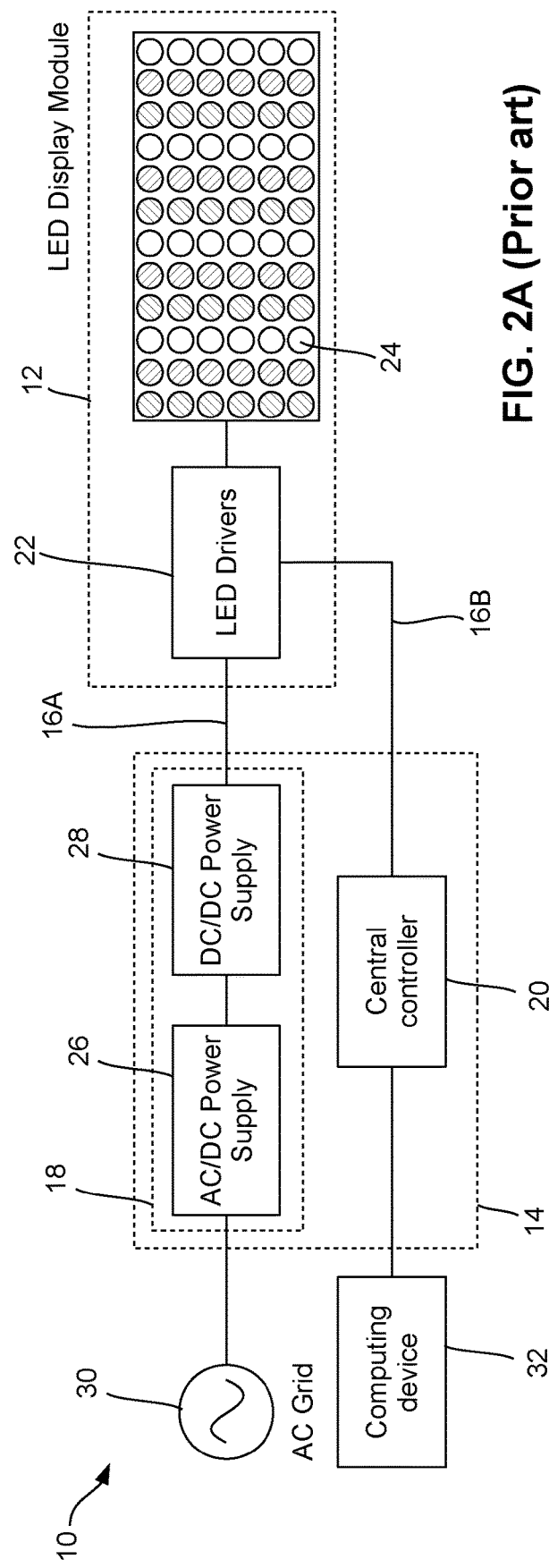
FIG. 2A is a schematic block diagram of the prior-art digital LED signage display shown in FIG. 1.
Figure 2B:
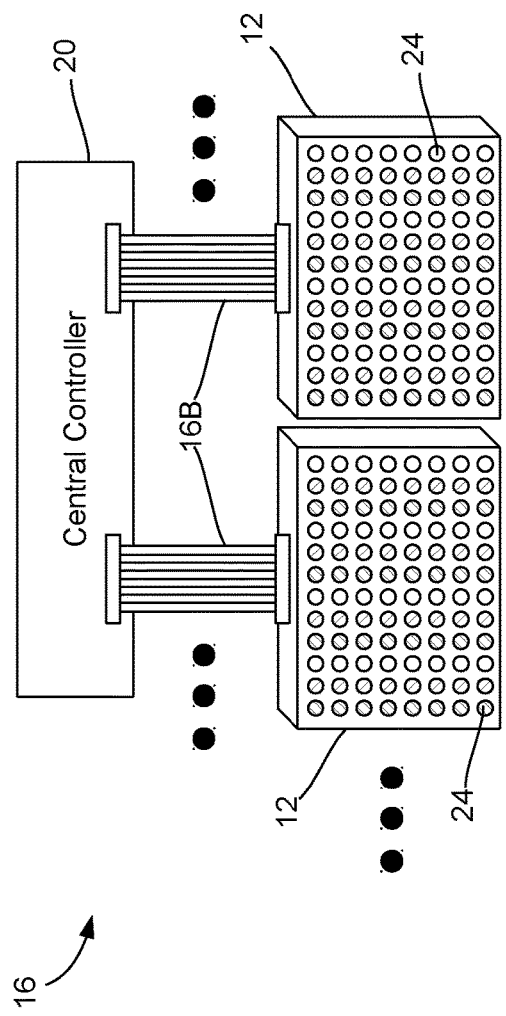
FIG. 2B is a schematic block diagram showing an example of a central controller connected to one or more LED display modules via a plurality of wires in the prior-art digital LED signage display shown in FIG. 1.
Figure 3:
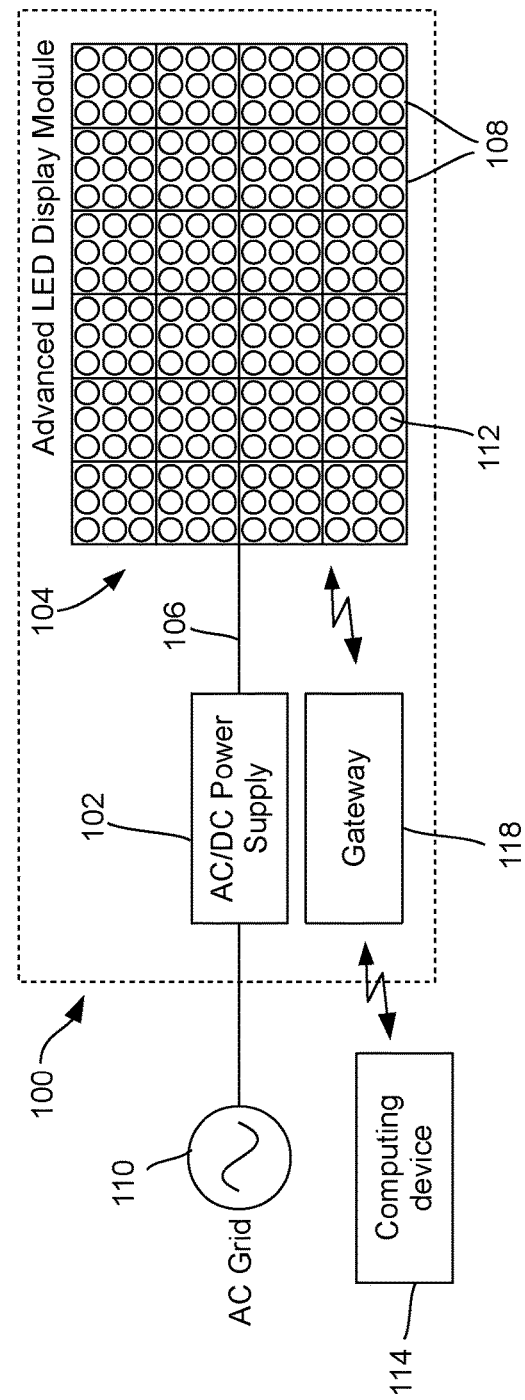
FIG. 3 is a simplified schematic block diagram of an LED display system having an LED signage display, according to some embodiments of this disclosure.

Turning now to FIG. 3, an example of the present LED apparatus in the form of a digital LED signage display is shown and is generally identified using reference numeral 100. As shown, the digital LED signage display 100 comprises an advanced LED display module 104 formed by a plurality of LED display submodules 108. Each LED display submodule 108 comprises a plurality of LEDs 112 drivable at a driving DC voltage such as 5V, 7.5V, 12V, or the like, depending on the implementation.

The digital LED signage display 100 also comprises a power source or a power supply 102 in the form of an AC/DC power converter in electrical connection with the LED display submodules 108 of the advanced LED display module 104, and a gateway 118 in wireless communication with the LED display submodules 108 of the LED display module 104.

The AC/DC power supply 102 may be mounted at a suitable location of the digital LED signage display 100 and may be physically separated from the advanced LED display module 104. The AC/DC power supply 102 converts the electrical power of an external AC power source 110 (such as an AC power grid) into a source DC power at a source DC voltage and outputs the source DC power to the LED display submodules 108 via a power cable 106 for powering the LEDs 112. The source DC voltage is generally higher than the driving DC voltage of the LEDs 112. In some embodiments, the source DC voltage of the AC/DC power supply 102 is higher than 7.5V. In some embodiments, the source DC voltage of the AC/DC power supply 102 is higher than 12V. In some embodiments, the source DC voltage of the AC/DC power supply 102 is about 48V.

The AC/DC power supply 102 outputs a higher source DC voltage compared to the prior-art, low-voltage power distribution LED signage displays. Therefore, the electrical current passing through the power cable 106 and consequently the energy loss on the power cable 106 and heat generated therefrom are substantially smaller than that of the prior-art designs that have similar constant power consumption. Furthermore, the high-voltage distribution (for example, 48V) significantly facilitates the integration of solar energy and energy storage (batteries) into the digital LED signage display 100. In comparison, the prior-art designs require multiple power conversion to implement solar energy and energy storage integration.

Referring again to FIG. 3, the gateway 118 is configured for wirelessly communicating with the LED display submodules 108 and with an external computing device 114 such as a desktop computer, a laptop computer, a smartphone, a tablet, or the like. Therefore, a user (not shown) of the computing device 114 may initiate a command for controlling the LED signage display 100 and wirelessly sends the command to the gateway 118. In response to the command, the gateway 118 then wirelessly communicates with the LED submodules 108 to modulate the lighting of the LEDs 112 thereof.

In various embodiments, the wireless connection between the gateway 118 and the LED submodules 108 and/or the wireless connection between the gateway 118 and the external computing device 114 may be any suitable wireless communication technologies such as WI-FIC), (WI-FI is a registered trademark of the City of Atlanta DBA Hartsfield-Jackson Atlanta International Airport Municipal Corp., Atlanta, Ga., USA), BLUETOOTH® (BLUETOOTH is a registered trademark of Bluetooth Sig Inc., Kirkland, Wash., USA), ZIGBEE® (ZIGBEE is a registered trademark of ZigBee Alliance Corp., San Ramon, Calif., USA), wireless mobile telecommunications technologies (such as GSM, CDMA, LTE, and the like), and/or the like.

Figure 4A:
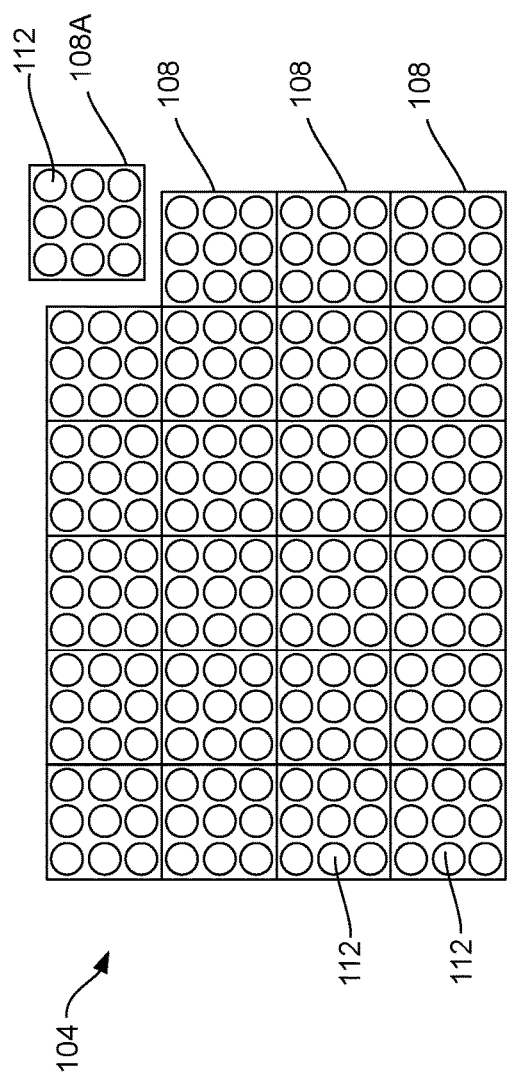
FIG. 4A is a schematic front view of an LED display module shown in FIG. 3, wherein the LED display submodule at the upper-right corner thereof is shown separated from other LED display submodules for clearer illustration of the submodule.
Figure 4B:
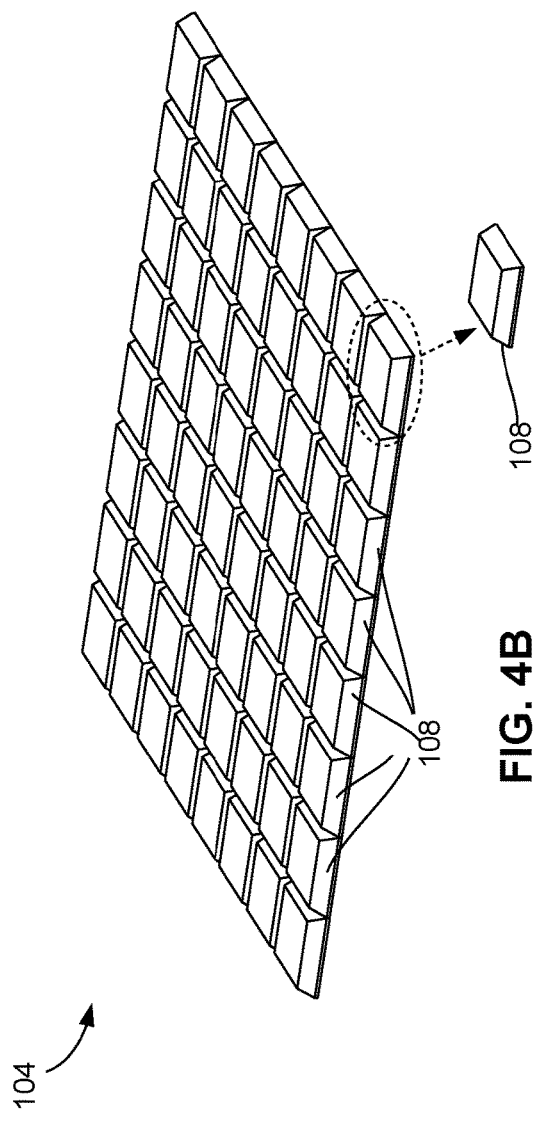
FIG. 4B is a schematic perspective view of an LED display module shown in FIG. 3, showing the rear side thereof.

As shown in FIGS. 4A to 4C, each LED display module 104 in these embodiments is a flexible LED display module and comprises a plurality of LED display submodules 108 coupled to each other in a flexible manner. Each LED display submodule 108 comprises one or more LEDs 112. Therefore, unlike the prior-art LED signage displays that generally have a planar display surface, the flexible LED display module 104 may be configured to form a non-planar display surface 116, for example a curved display surface 116 such as shown in FIG. 4C. In other embodiments, at least one LED display module 104 may be a conventional, non-flexible LED display module.

In FIGS. 4A to 4C, the LED display submodules 108 are arranged as a matrix having a plurality of rows and columns. In other embodiments, the LED display submodule 108 may be arranged in different configurations such as in different numbers of rows and columns and/or in different layouts such as triangles, circles, and the like.

In the example shown in FIG. 4A, each LED display submodule 108 comprises nine (9) LED pixels (being nine tri-color LEDs 112 or 27 single-color LEDs 112, described in more detail later) arranged in a 3-by-3 matrix which is optimal for this example of an integrated solution based on Applicant's power-loss calculation. However, in other embodiments, an LED display submodule 108 may comprise different numbers of LEDs 112, and the LEDs 112 may be arranged in different configurations such as in different numbers of rows and columns, and/or in different layouts such as triangles, circles, and the like.

Each LED display submodule 108 comprises one or more LED pixels. Depending on the types of the LEDs, each LED pixel may comprise one multi-color LED 112, or a set of three single-color LEDs 112 (Red, Green and Blue) arranged in proximity with each other. FIG. 5A shows an LED display submodule 108 having nine (9) tri-color LEDs 112. FIG. 5B shows an LED display submodule 108 having nine (9) sets of LEDs 112. Each LED set comprises three single-color LEDs (Red, Green and Blue) forming a pixel of the LED display submodule 108.

FIG. 6A is a cross-sectional view of an LED display submodule 108 having a plurality of multi-color LEDs 112. FIG. 6B is a cross-sectional view of an LED display submodule 108 having a plurality of single-color LEDs 112. FIG. 6B is generally the same as FIG. 6A except that the types and numbers of the LEDs in the two figures are different.

As shown in FIGS. 6A and 6B, the LED display submodule 108 comprises an enclosure (which may also be referred to as a case) 202. In this embodiment, the enclosure 202 has a frustum shape such as a square frustum and comprises a front opening 204 (corresponding to the front side of the LED display module 104) a rearwardly tapering sidewall 206, and a rear wall 208 coupled to the sidewall 206. Therefore, the front opening 204 has a larger area than that of the rear wall 208.

The LED display submodule 108 also comprises a Printed Circuit Board (PCB) 222 coupled to the enclosure 202 about the front opening 204 thereof by fastening the PCB 222 onto a plurality of anchors 226 of the enclosure 202 using a plurality of micro screws 224.

Although not shown, in this embodiment, the enclosure 202 is filled with suitable potting material which may comprise for example, a solid or gelatinous compound such as thermo-setting plastics, silicone, epoxy, and/or the like, for encapsulating the PCB 222 and components thereon, and for protecting the PCB 222 and components thereon from physical shocks, moisture, and/or the like.

The LEDs 112 are coupled to the PCB 222 on the front side 232 thereof. A plurality of electrical components for modulating and supplying power to the LEDs 112, for example a power integrated circuit (IC) chip 234, resistors/capacitors 236, and the like, are coupled to the PCB 222 on the rear side 238 thereof. The PCB 222 comprises necessary printed conductive strips/wires (not shown) for electrically connecting the LEDs 112, the electrical components 234 and 236, and at least a pair of electrical connection terminals (not shown). In this embodiment, the power IC chip 234 receives power from the high-voltage distribution bus (such as 48V), and provides multiple DC outputs to the LEDs 112 in the LED display submodule 108.

Figure 7:
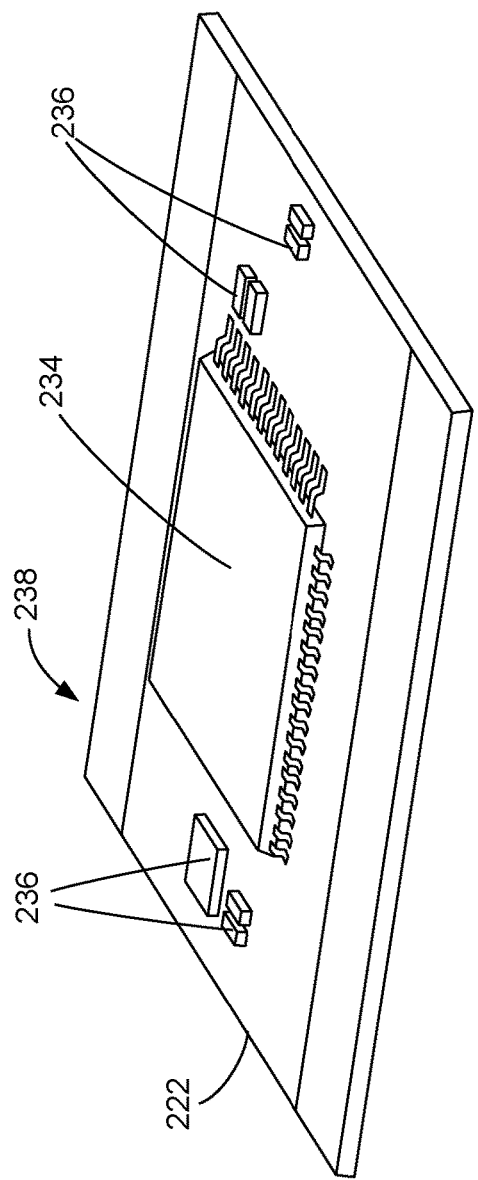
FIG. 7 is a perspective view of a Printed Circuit Board (PCB) of the LED display submodule shown in FIG. 6A.

FIG. 7 is a perspective view of the PCB 222, showing the rear side 238 of the PCB 222 and the electrical components 234 and 236 thereon. For ease of illustration, the LEDs are not shown in FIG. 7.

In these embodiments, the enclosure 202 is made of a rigid material such as steel, plastic, hard rubber, and the like, and therefore the enclosure 202 itself is non-flexible or only slightly flexible without damaging the components therein. However, the LED display submodules 108 may be combined in a way that the assembled LED display module 104 is flexible and may be configured to have a curved display surface 116.

Figure 8:
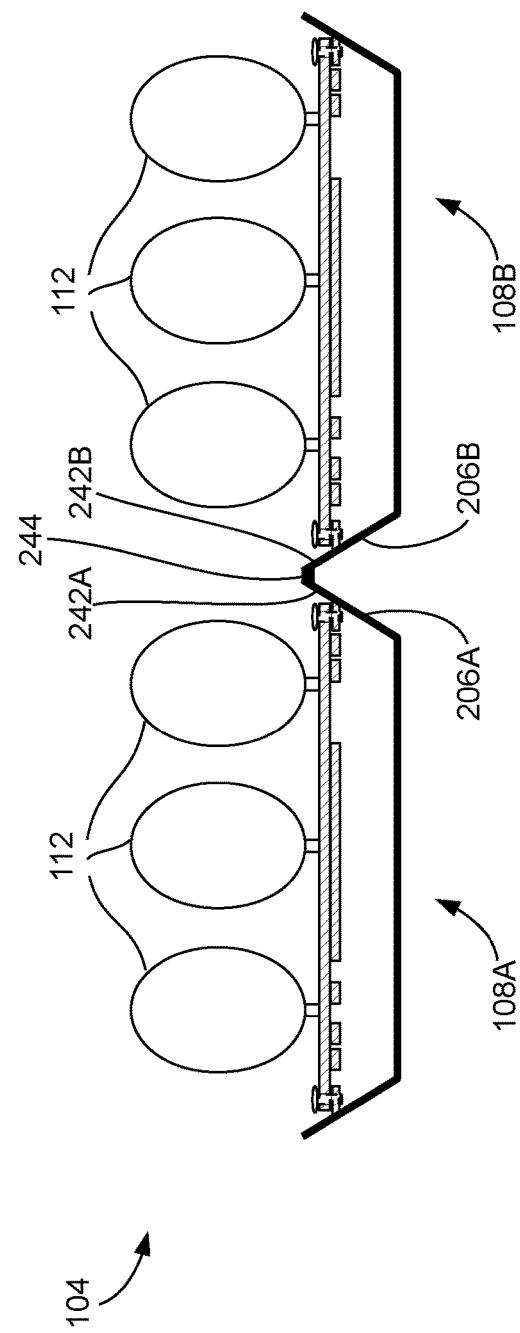
FIG. 8 is a cross-sectional view of two LED display submodules coupled together for forming an LED display module, according to some embodiments of this disclosure.

FIG. 8 shows how the LED display submodules 108 in some embodiments are coupled together to form a flexible LED display module 104. As shown, two LED display submodules 108A and 108B are arranged side-by-side, and are flexibly coupled together at the neighboring edges 242A and 242B of the respective sidewalls 206A and 206B of the LED display submodules 108A and 108B by a flexible coupling structure 244 such as glue, hinge, clip, strip, and/or the like, to allow the two LED display submodules 108A and 108B to be moderately flexible about the flexible coupling structure 244.

Figure 9A:
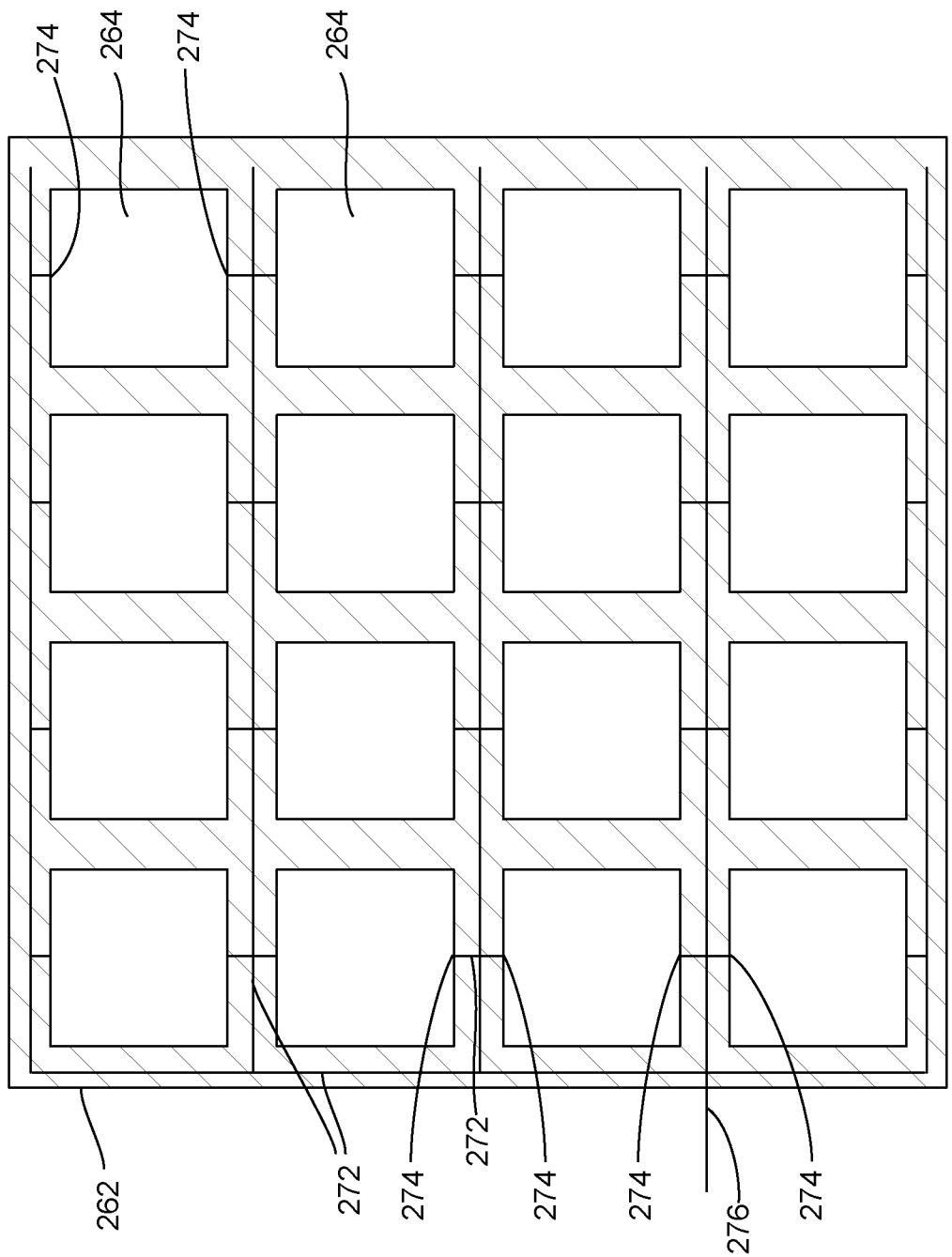
FIG. 9A is a schematic cross-sectional view of a flexible housing structure of an LED display module, according to some alternative embodiments of this disclosure, the flexible housing structure having cells for receiving and mounted therein LED display submodules.

In some embodiments as shown in FIG. 9A, the LED display module 104 comprises a flexible housing structure 262 made of a flexible material such as flexible rubber, and comprises a plurality of cells 264 (such as openings in some embodiments) matching the shape of the LED display submodules 108. The flexible housing structure 262 also comprises a plurality of interconnected, flexible electrical conductors 272 such as conductive wires embedded therein and flexible therewith. The interconnected electrical conductors 272 are connected to a lead conductor 276 for electrically connecting to a power source.

Each electrical conductor 272 comprises at least two conductive wires. For example, in one embodiment, each electrical conductor 272 comprises a pair of conductive wires, with one wire configured as a ground wire and the other as a 48V power wire for powering the LED display submodules 108.

Each cell 264 comprises at least one set of electrical terminals 274 located on and exposed from the walls thereof, and connected to the electrical conductors 272 in such a manner that the electrical terminal sets 274 are electrically connected in parallel through the electrical conductors 272. For example, in FIG. 9A, each cell 264 comprises two sets of electrical terminals 274 located on and exposed from the opposite walls thereof. Both sets of electrical terminals 274 are connected to the electrical conductors 272.

Figure 9C:
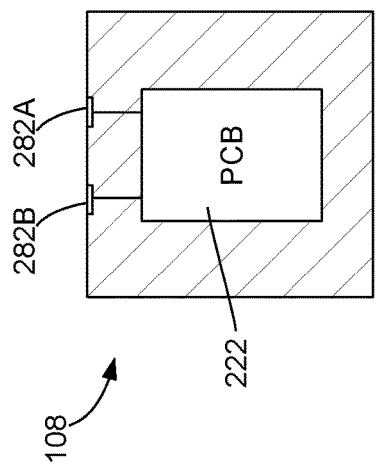
FIG. 9C is a schematic cross-sectional view of an LED display submodule for installation in a cell of the flexible housing structure shown in FIG. 9A.
Figure 9D:
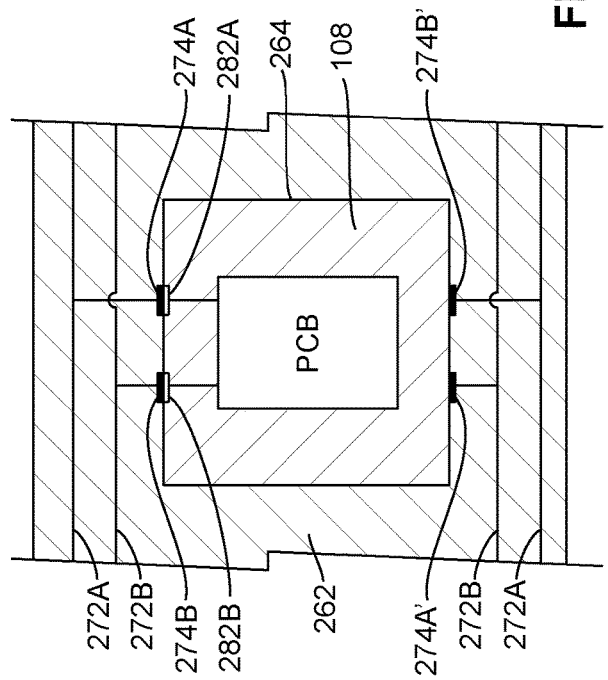
FIG. 9D is a schematic cross-sectional view of an enlarged portion of the flexible housing structure (shown in FIG. 9A) with an LED display submodule (shown in FIG. 9C) installed therein.
Figure 9B:
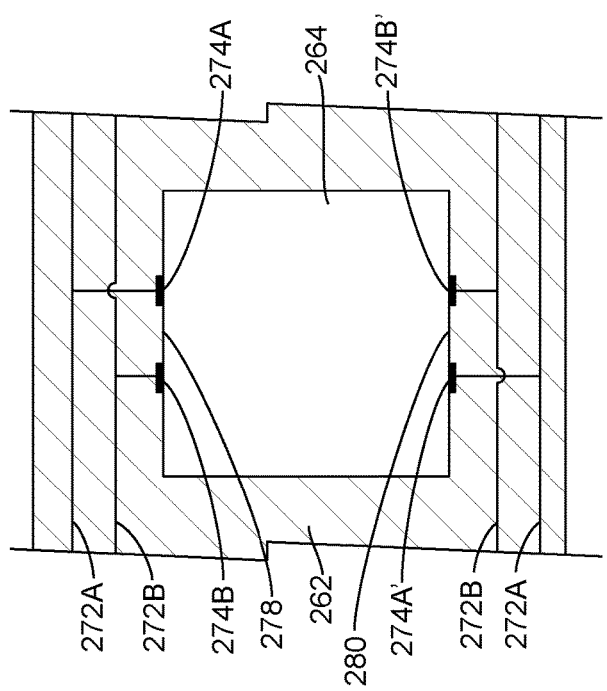
FIG. 9B is a schematic cross-sectional view of an enlarged portion of the flexible housing structure shown in FIG. 9A.

FIG. 9B shows an enlarged portion of the flexible housing structure 262. As shown, each electrical line 272 comprise two wires including a first wire 272A as the 48V power wire and a second wire 272B as the ground wire. Correspondingly, each cell 264 comprises two pairs of terminals (274A, 274B) and (274A', 274B') located on and exposed from opposite walls 278 and 280 thereof, respectively. The terminals 274A and 274A' are power-line terminals connected to the 48V power wire 272A, and the terminals 274B and 274B' are ground terminals connected to the ground wire 272B.

As shown in FIG. 9C, each LED display submodule 108 comprises a pair of electrical terminals 282A and 282B located on and exposed from a sidewall thereof, and connected to the PCB 222 thereof. The electrical terminals 282A and 282B are used as the power input and the ground, respectively.

As shown in FIG. 9D, an LED display submodule 108 may be fit into a cell 264 of the flexible housing structure 262. Then, the power input terminal 282A of the LED display submodule 108 is in electrical contact with the power-line terminal 274A of the cell 264, and the ground terminal 282B of the LED display submodule 108 is in electrical contact with the ground terminal 274B of the cell 264. In this way, each LED display submodule 108, after fitting into a cell 264, is electrically connected to the lead conductor 276.

Figure 9E:
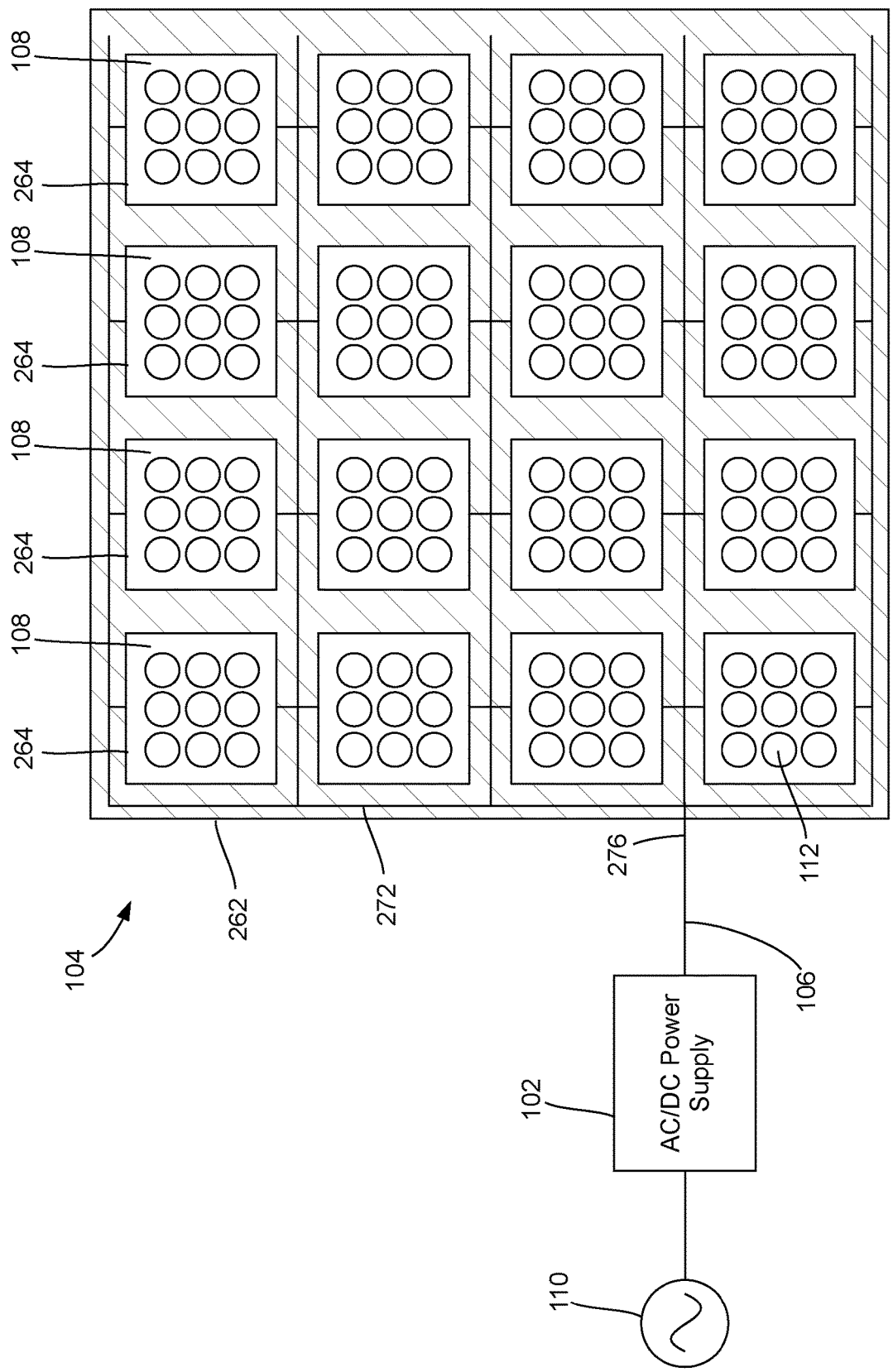
FIG. 9E is a schematic cross-sectional view of a flexible LED display module having a flexible housing structure (shown in FIG. 9A) with a plurality of LED display submodules (shown in FIG. 9C) installed therein.

As shown in FIG. 9E, after fitting all LED display submodules 108 into the cells 264 of the flexible housing structure 262, an LED display module 104 is then assembled. The LED display module 104 may be connected to an external power source 110 by connecting the lead conductor 276 to the AC/DC power supply 102 via the cable 106, and connecting the AC/DC power supply 102 to the external power source 110.

In some alternative embodiments, the LED display submodules 108 are electrically connected using conductive strips, for example, ribbon cables, with releasable fasteners such as snap fasteners. This connection mechanism is suitable for both the LED display module 104 without a flexible housing structure (for example, that shown in FIG. 8) and the LED display module 104 with a flexible housing structure (for example, that shown in FIG. 9E but without the embedded electrical conductors).

Figure 10B:
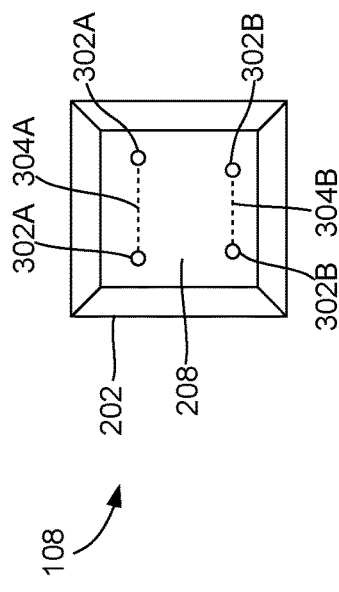
FIG. 10B is a schematic top view of the LED display submodule shown in FIG. 10A.
Figure 10D:
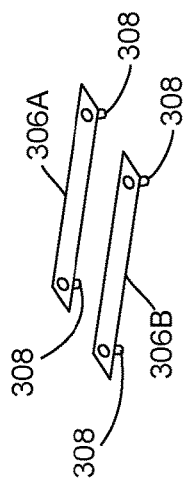
FIG. 10D shows a pair of conductive strips for electrically connecting neighboring LED display submodules (shown in FIG. 10A) in an LED display module.
Figure 10E:
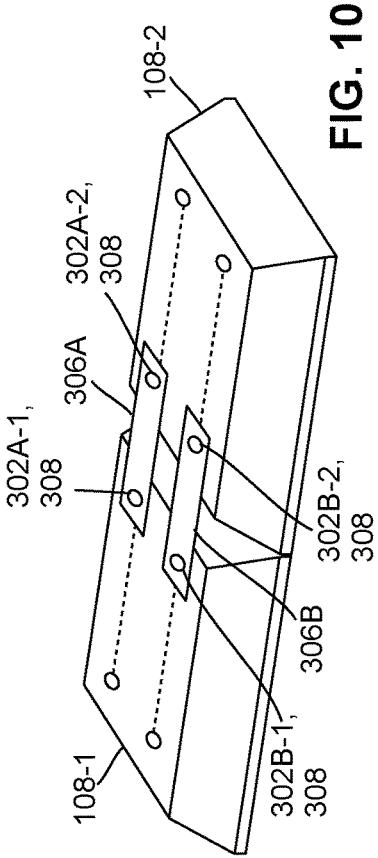
FIG. 10E shows two LED display submodules shown in FIG. 10A coupled together and electrically connected together using a pair of conductive strips shown in FIG. 10D.
Figure 10A:
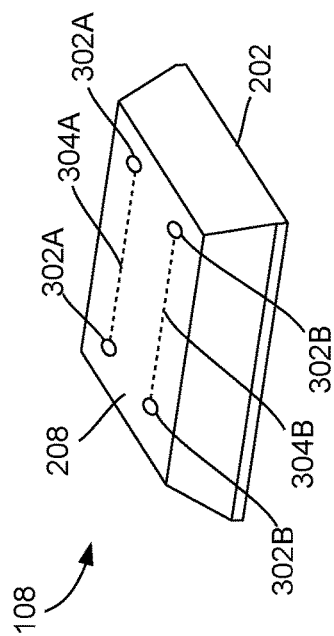
FIG. 10A is a schematic perspective view of an LED display submodule, according to some alternative embodiments.

FIGS. 10A and 10B are a schematic perspective view and a schematic plan view, respectively, of an LED display submodule 108 according to these embodiments. As shown, the LED display submodule 108 comprises an electrically-conductive, mechanical coupling structure (302A, 302B) in the form of two pairs of electrical conductive recesses on the rear wall 208 of the enclosure 202 located about the opposite edges of the rear wall 208 for mechanically and electrically coupling with flexible electrical-connectors such as flexible and electrically conductive strips 306A and 306B (see FIG. 10D, described in more detail later). The two recesses 302A (also denoted as the power-input recesses) are electrically connected via a conductive link 304A within the enclosure 202, and are configured for electrically connecting to the PCB (not shown) as the 48V power-input. The other two recesses 302B (also denoted as the ground recesses) are electrically connected via a conductive link 304B within the enclosure 202, and are configured for electrically connecting to the PCB (not shown) as the ground.

As described above, a plurality of LED display submodules 108 may be coupled together in a side-by-side manner to form an LED display module 104. In various embodiments, the plurality of LED display submodules 108 may be coupled together without using a housing structure, or with the use of flexible housing structure. The method described in the follows is based on coupling the plurality of LED display submodules 108 without using a housing structure. However, the same method is also readily applicable for coupling a plurality of LED display submodules 108 using a flexible housing structure.

Figure 10C:
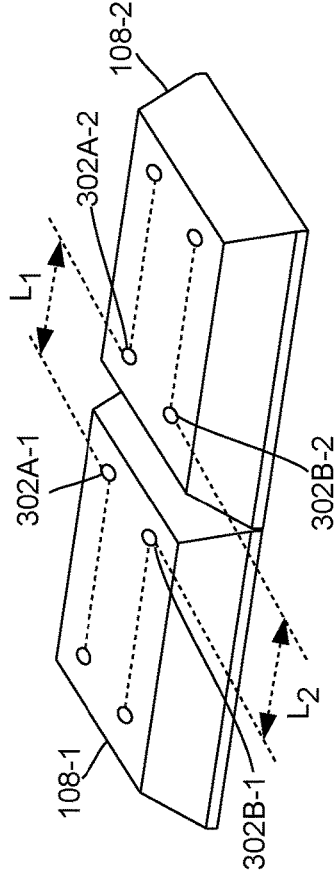
FIG. 10C shows two LED display submodules (shown in FIG. 10A) coupled together.

FIG. 10C shows two LED display submodules 108-1 and 108-2 coupled together. The distance between the power-input recesses 302A-1 and 302A-2 about the neighboring sides of the LED display submodules 108-1 and 108-2 is $L_1$, and the distance between the ground recesses 302B-1 and 302B-2 about the neighboring sides of the LED display submodules 108-1 and 108-2 is $L_2$.

As shown in FIG. 10D, a pair of flexible and electrically conductive strips 306A and 306B, for example a pair of ribbon cables, may be used for electrically connecting the two LED display submodules 108-1 and 108-2. Each flexible conductive-strip 306A, 306B comprises an electrically-conductive, mechanical coupling structure 308 in the form of a pair of conductive extrusions on the opposite sides thereon and electrically connected by the flexible conductive-strip 306A, 306B, for electrically and mechanically engaging the coupling structure 302A or 302B of the LED display submodule 108.

In particular, the extrusion 308 of the flexible conductive-strip 306A, 306B engages the recess 302A, 302B on the LED display submodule 108 to form a snap fastener. The lengths of the flexible conductive-strips 306A and 306B are slightly longer than $L_1$ and $L_2$, respectively. Therefore, each flexible conductive-strip 306A, 306B has a length sufficient for removably and electrically connecting respective conductive recesses 302A, 302B of neighboring LED display submodules.

As shown in FIG. 10E, the flexible conductive-strip 306A may be coupled to the two LED display submodules 108-1 and 108-2, and electrically connect the recesses 302A-1 and 302A-2 by respectively snapping and locking the opposite extrusions 308 into the recesses 302A-1 and 302A-2. Similarly, the flexible conductive-strip 306B may be coupled to the two LED display submodules 108-1 and 108-2, and electrically connect the recesses 302B-1 and 302B-2 by respectively snapping and locking the opposite extrusions 308 into the recesses 302B-1 and 302B-2.

Figure 10F:
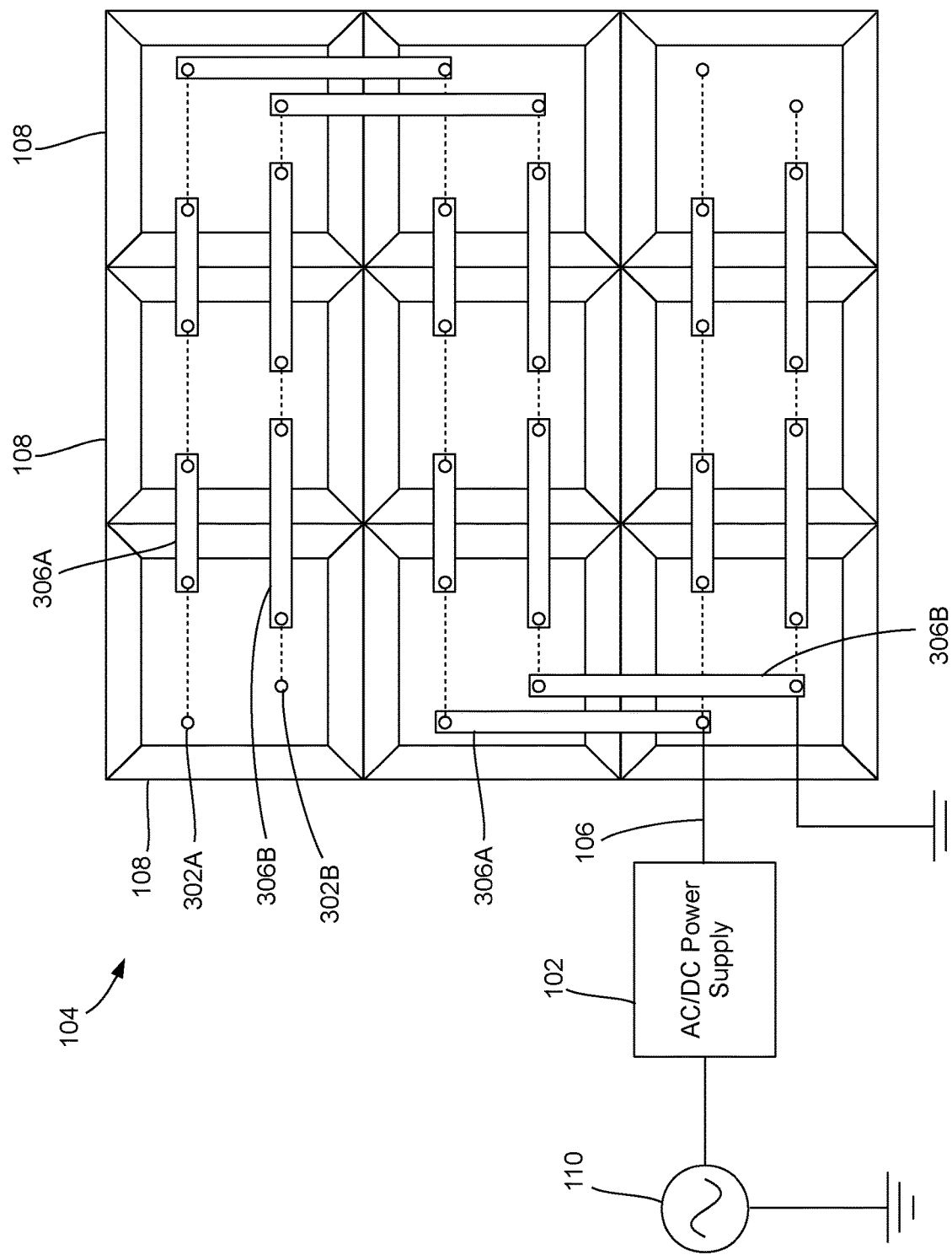
FIG. 10F is a schematic top view of a flexible LED display module having a plurality of LED display submodules shown in FIG. 10A, the plurality of LED display submodules being interconnected using strips shown in FIG. 10D.

FIG. 10F shows a flexible LED display module 104 formed by a plurality of LED display submodules 108. The plurality of LED display submodules 108 are interconnected by using a plurality of flexible conductive-strips 306A and 306B, which are in turn connected to an external power source 110 via the cable 106 and the AC/DC power supply 102.

In some alternative embodiments where a flexible housing structure 262 is used for accommodating and assembling LED display submodules 108, the above-described embedded electrical conductors 272 and flexible conductive-strips 306A and 306B may be used together for interconnecting the LED display submodules 108.

For example, in some embodiments, the flexible housing structure 262 comprises a set of electrical conductors 272 embedded therein for interconnecting a first portion of the LED display submodules 108, and flexible conductive-strips 306A and 306B are used for interconnecting a second portion of the LED display submodules 108.

In some other embodiments, the LED display module 104 is formed as shown in FIG. 9E. In other words, all LED display submodules 108 are installed onto the flexible housing structure 262 and are interconnected by the electrical conductors 272 embedded therein. As those skilled in the art will appreciate, the embedded electrical conductors 272 may wear out and break over time during use. Therefore, in these embodiments, a plurality of flexible conductive-strips 306A and 306B are used as backup electrical connectors for connecting one or more LED display submodules 108 in the event that the embedded electrical conductors 272 that connect these LED display submodules 108 are broken.

Figure 11C:
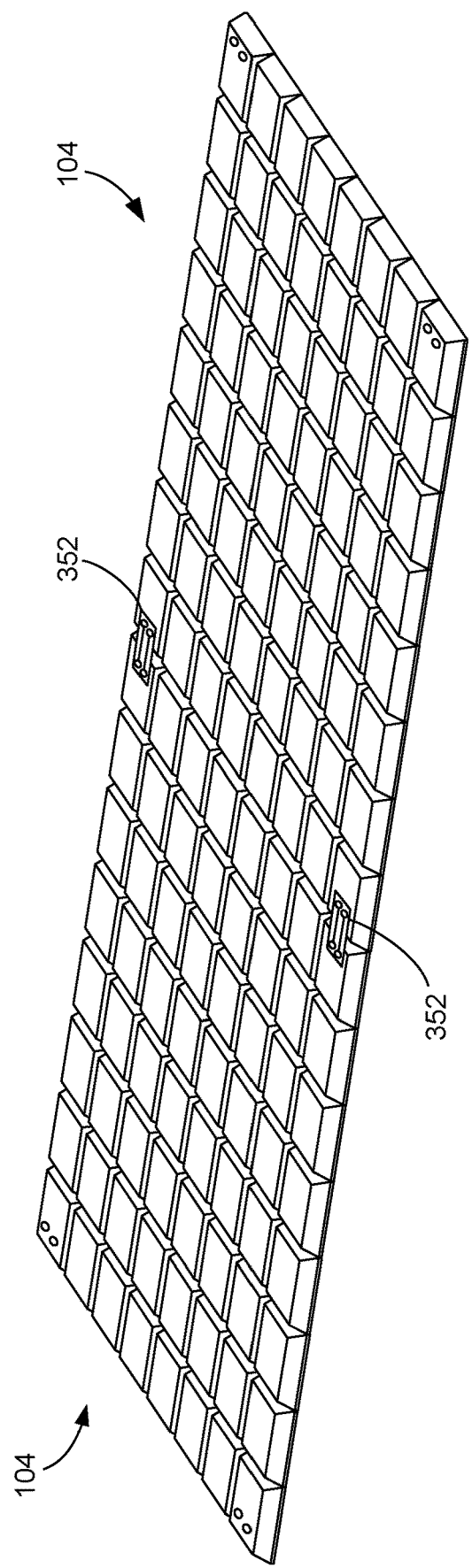

FIGS. 11A to 11C show a method for connecting LED display modules 104 in some alternative embodiments. As shown in FIG. 11A, an LED display module 104 comprises four connector submodules 108A at the four corners thereof. Each corner submodule 108A comprises a pair of electrically conductive recesses 350. FIG. 11B is a perspective view of a flexible connector or conductive strip 352. The conductive strip 352 comprises two pairs of conductive extrusions (354A, 354B) and (354A', 354B') on the opposite sides thereof, respectively, for electrically conductively coupling to the recesses 350 of the LED display module 104. The extrusions 354A and 354A' are connected via an electrical strip 356A, and the extrusions 354B and 354B' are connected via an electrical strip 356B. As shown in FIG. 11C, two LED display modules 104 and 104 may be electrically connected using one or more conductive strips 352.

FIG. 12A shows an LED display module 104 in some alternative embodiments. The LED display module 104 is similar to that shown in FIG. 11A except that in these embodiments, the four connector submodules 362 at the four corners of the LED display module 104 have a reduced thickness. Similar to the connector submodules 108A shown in FIG. 11A, each connector submodule 362 shown in FIG. 12A comprises a pair of electrically conductive recesses 350.

As shown in FIG. 12B, two LED display modules 104 may be electrically connected by using conductive strips 352 to connect neighboring connector submodules 362 in a manner similar to that shown in FIG. 11C. As the connector submodules 362 has reduced thickness, the conductive strips 352 would not extrude from the rear side of the LED display module 104 when attached to the connector submodules 362.

In above embodiments, the LED display submodules 108 generally have a same shape. In some alternative embodiments, the LED display submodules 108 may have different shapes.

For example, in one embodiment as shown in FIGS. 13A and 13B, the LED display module 104 may be formed by two types of LED display submodules 108A and 108B. The LED display submodule 108A has substantially same length and width, and the LED display submodule 108B has a length much longer than the width thereof.

As shown in FIG. 13A, the submodule 108A comprises a pair of electrically conductive terminals 382 extruding from a side 384 thereof. Correspondingly, the submodule 108B comprises a pair of electrically conductive channels or recesses (not shown) on a corresponding side 388 thereof for receiving the terminals 382 of the submodule 108A for electrically connecting the two submodules 108A and 108B. After connection, the two submodules 108A and 108B then form a module column for assembling the LED display module 104.

As shown in FIG. 13B, a plurality of module columns 386 are assembled together using suitable fasteners such as glue, screws, nails, strips, and/or the like, to form the LED display module 104. Although not shown, the plurality of module columns 386 may be electrically connected using conductive strips as described above.

FIGS. 14A to 14F show an LED display module 104 in some alternative embodiments. As shown in FIGS. 14A and 14B, the LED display module 104 comprises a flexible housing structure 262 made of a suitable flexible material such as flexible rubber. As described before, the flexible housing structure 262 comprises a plurality of cells or pockets 264, a central pocket 266, and four corner pockets 268 at the four corners thereof, for receiving therein a plurality of LED display submodules (not shown). The central pocket 266 may also receive therein other necessary circuits and components. Each corner pocket 268 comprises a pair of rearwardly extending, cylindrical extrusions 404. Each extrusion 404 comprises a magnet as an attachment means (described later). As shown in FIG. 14F, each extrusion 404 also comprises one or more electrical terminals and necessary wiring for electrically connecting the electrical terminals to the LED display submodule thereof. One of the pair of the extrusions 404 is used for data communication of LED display submodule, and the other one of the extrusions 404 is used for power input to the LED display submodule.

As shown in FIGS. 14C and 14D, the LED display module 104 also comprises one or more dual-attachment plates 412. As shown, the dual-attachment plate 412 comprises two halves 412A and 412B made of a suitable rigid material such as rigid rubber and flexibly coupled together. Each half 412A, 412B comprises a pair of recesses 414 for receiving the pair of extrusions 404 of a corner pocket 268. Each recess 414 comprises a magnet of an opposite pole of the corresponding extrusion 404 of the corner pocket 268, and also comprises electrical terminals and necessary wiring for electrically connecting the electrical terminals to a flexible PCB or a ribbon cable 418 extending across the first and second halves 412A and 412B. In these embodiments, the dual-attachment plate 412 comprises a mounting structure in the form of two screw holes 416 on the two halves 412A and 412B, respectively, for attaching the dual-attachment plate 412 to a surface of a mounting equipment such as a display stand (not shown) using a suitable fastener such as a screw or a nail.

As shown in FIGS. 14E and 14F, and as indicated by the arrows 422, two LED display modules 104 may be arranged side-by-side, and a dual-attachment plate 412 is placed onto the neighboring corner pockets 268 of the two LED display modules 104 such that each extrusion 404 is received in a corresponding recess 414. The magnetic force of the opposite-pole magnets in the extrusion 404 and the recess 414 firmly couples the dual-attachment plate 412 to the two LED display modules 104, and the electrical terminals therein are in electrical contact with teach other. Thus, the dual-attachment plate 412 also acts as an electrical connector connecting the circuits of the two LED display modules 104.

In some embodiments, the LED display module 104 further comprises an attachment structure 430 in the form of a single-attachment plate as shown in FIG. 15. The single-attachment plate 430 is similar to the first or the second half 412A or 412B of the dual-attachment plate 412. That is, the single-attachment plate 430 is made of a suitable rigid material such as rigid rubber, and comprises a pair of recesses 414 for receiving the pair of extrusions 404 of a corner pocket 268. Each recess 414 comprises a magnet of an opposite pole of the corresponding extrusion 404 of the corner pocket 268, and may also comprise electrical terminals for connecting to external cables such as a data cable and a power cable. In these embodiments, the single-attachment plate 430 also comprises a mounting structure in the form of a screw hole 416 for attaching the dual-attachment plate 412 to a surface of a mounting equipment such as a display stand (not shown) using a suitable fastener such as a screw or a nail.

Figure 16A:
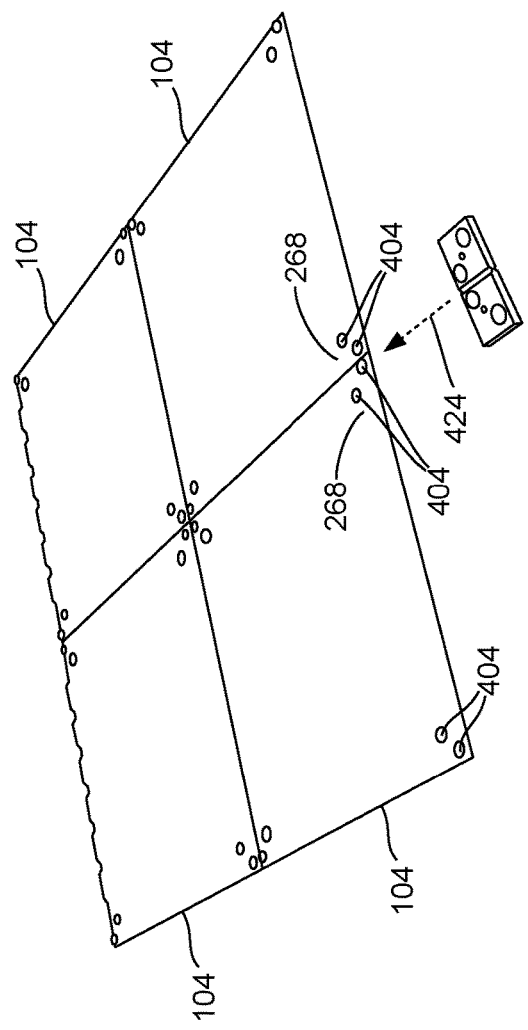
FIG. 16A shows four LED display modules are arranged side-by-side as a 2-by-2 matrix, and a dual-attachment plate is to be placed on to the neighboring corner pockets thereof.
Figure 16B:
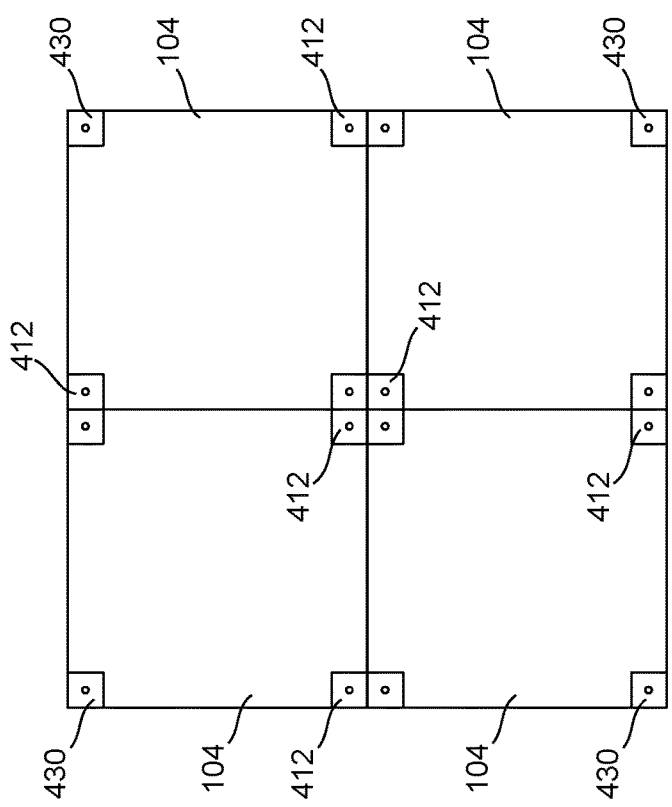
FIG. 16B shows the four LED display modules shown in FIG. 16A being electrically and mechanically connected using a plurality of dual- and single-attachment plates.

FIG. 16A shows four LED display modules 104 arranged side-by-side as a 2-by-2 matrix. A dual-attachment plate 412 is to be placed on to the neighboring corner pockets 268 thereof. FIG. 16B shows the four LED display modules 104 being electrically and mechanically connected using a plurality of dual- and single-attachment plates 412 and 430.

Figure 17B:
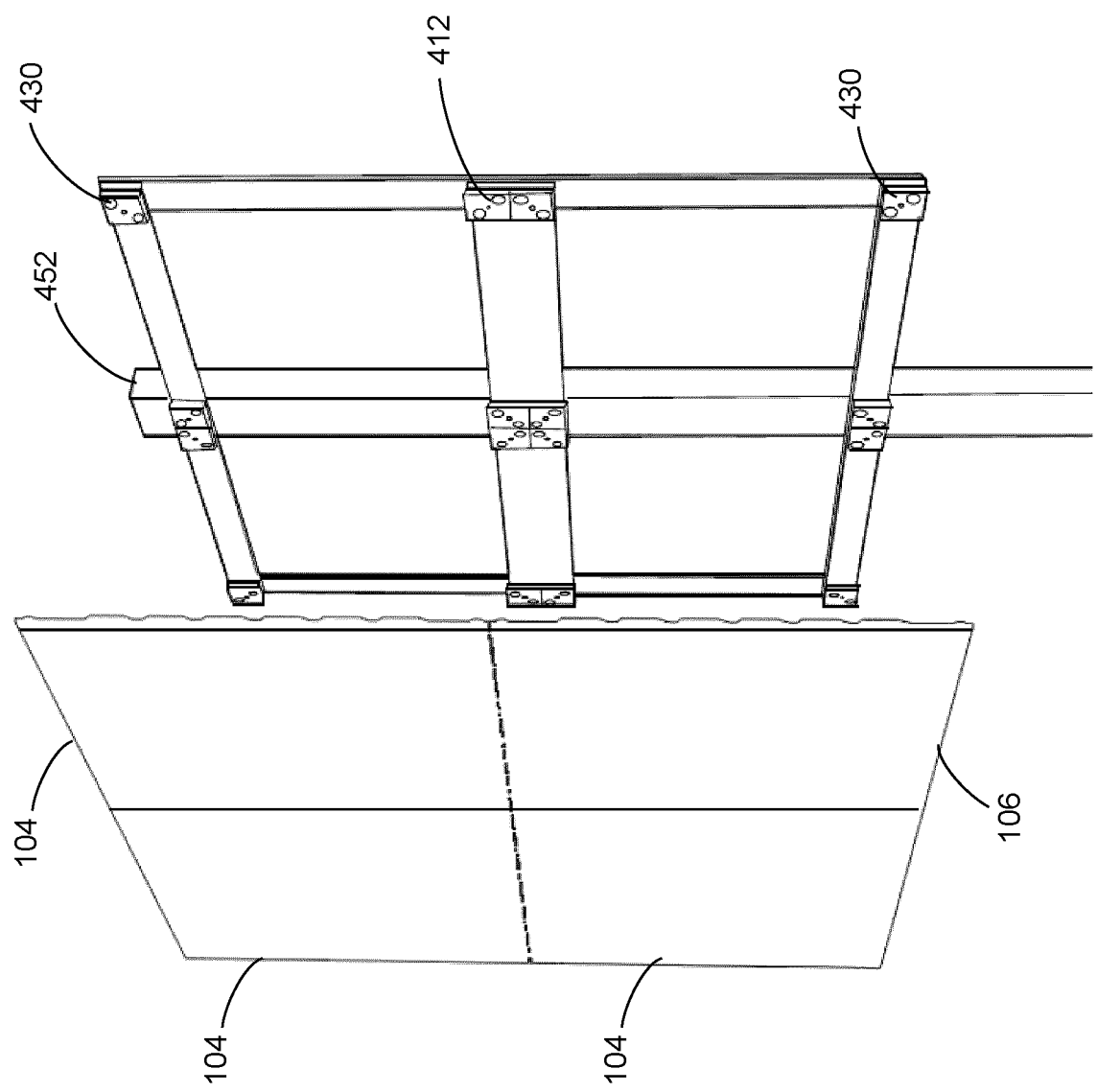

By using the dual-attachment and single-attachment plates 412 and 430, LED display modules 104 may be mounted to a suitable mounting structure. For example, FIGS. 17A to 17E show four LED display modules 104 being electrically interconnected and mounted onto a display stand 452. As shown in FIG. 17A, a plurality of dual-attachment and single-attachment plates 412 and 430 are first mounted onto the display stand 452 by fastening screws 454 through the screw holes 416 of the dual-attachment and single-attachment plates 412 and 430 onto the display stand 452.

As shown in FIG. 17B, four LED display modules 104 are then attached to the dual-attachment and single-attachment plates 412 and 430, thereby electrically interconnected and removably mounted onto the display stand 452.

Figure 17E:
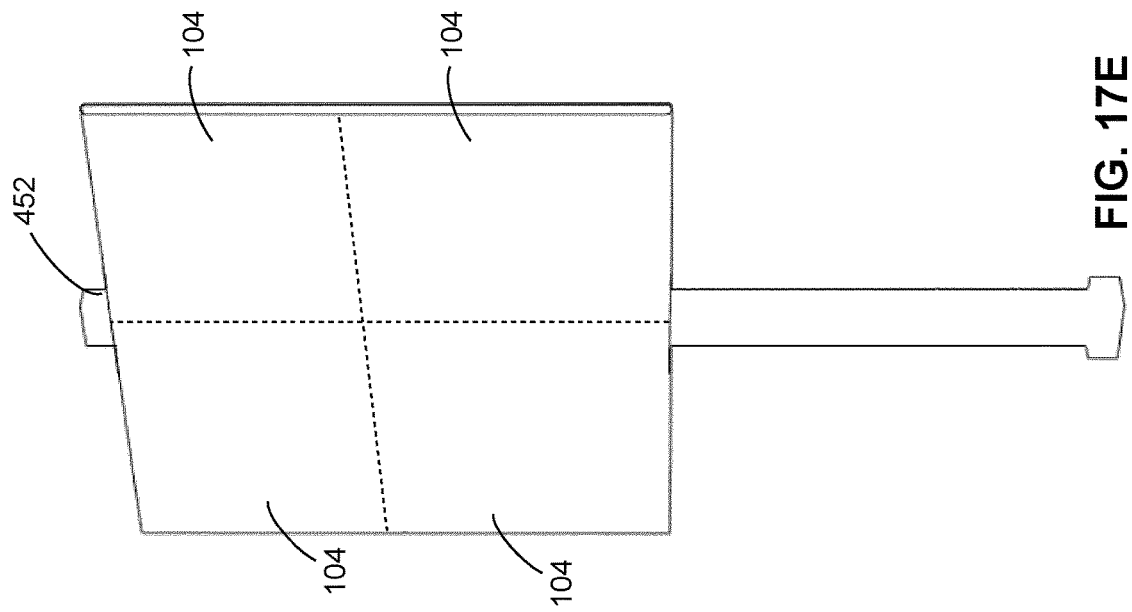
Figure 17D:
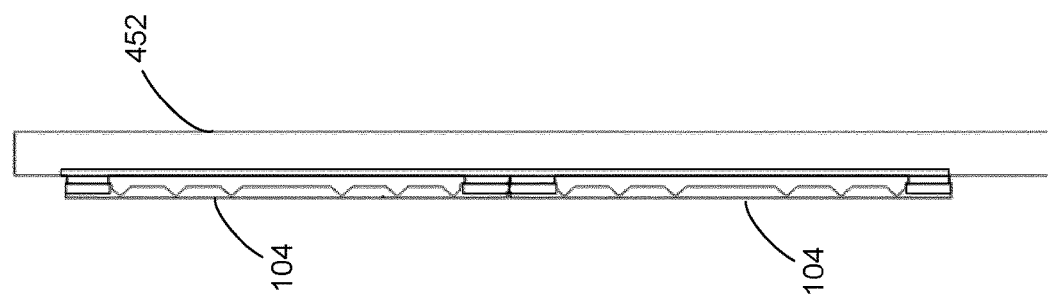
Figure 17C:
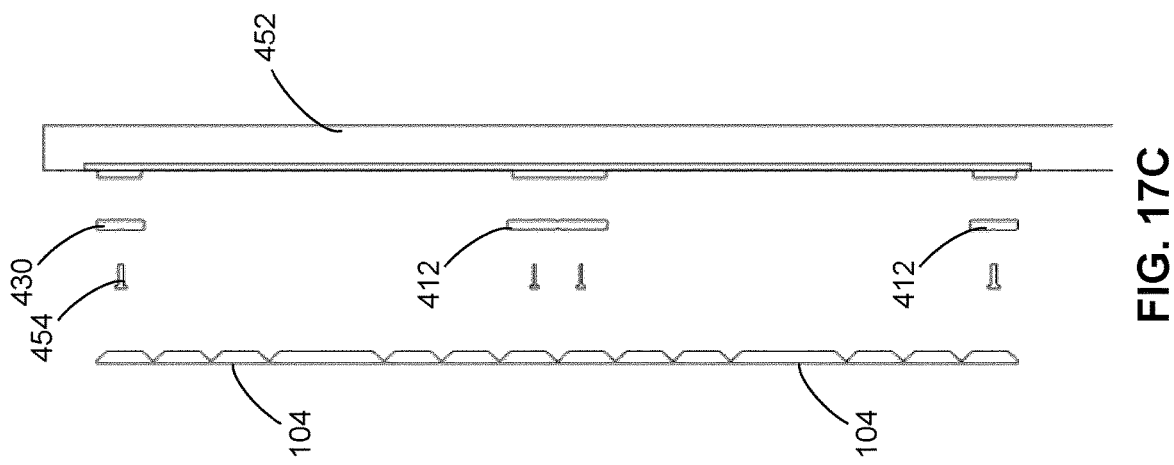

FIG. 17C is a side view of the LED display modules 104 and the display stand 452, showing how the LED display modules 104 are removably mounted onto the display stand 452. FIG. 17D is a side view of the LED display modules mounted onto the display stand 452. FIG. 17E is a perspective view of the LED display modules 104 mounted onto the display stand 452.

Figure 18B:
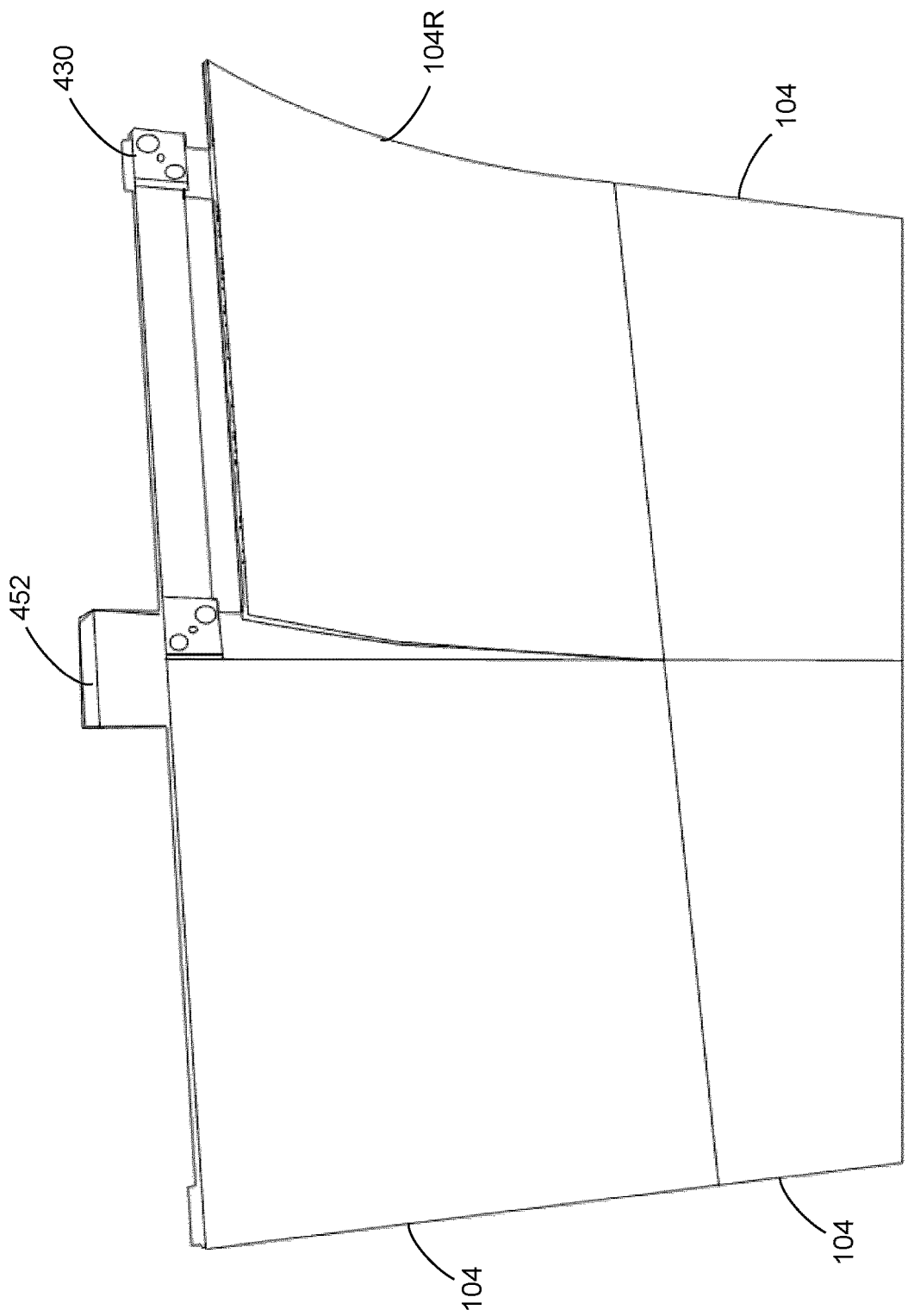

The above described electrical interconnection and mounting method has an advantage of easy and quick placement of LED display modules. FIGS. 18A and 18B show an example. As shown in FIG. 18A, an LED display module 104E is malfunctioning and need to be replaced. Therefore, one may apply an outward force to the LED display module 104E to overcome to magnetic force between the LED display module 104E and the dual- and single-attachment plates 412 and 430 to remove the LED display module 104E from the display stand 452. The flexibility of the LED display module 104E facilitates the removal of the LED display module 104E.

As shown in FIG. 18B, one may then attach a replacement LED display module 104R to the dual-attachment and single-attachment plates 412 and 430 to mount the replacement LED display module 104R onto the display stand 452. The flexibility of the LED display module 104R facilitates the attaching of the LED display module 104R.

Figure 19B:
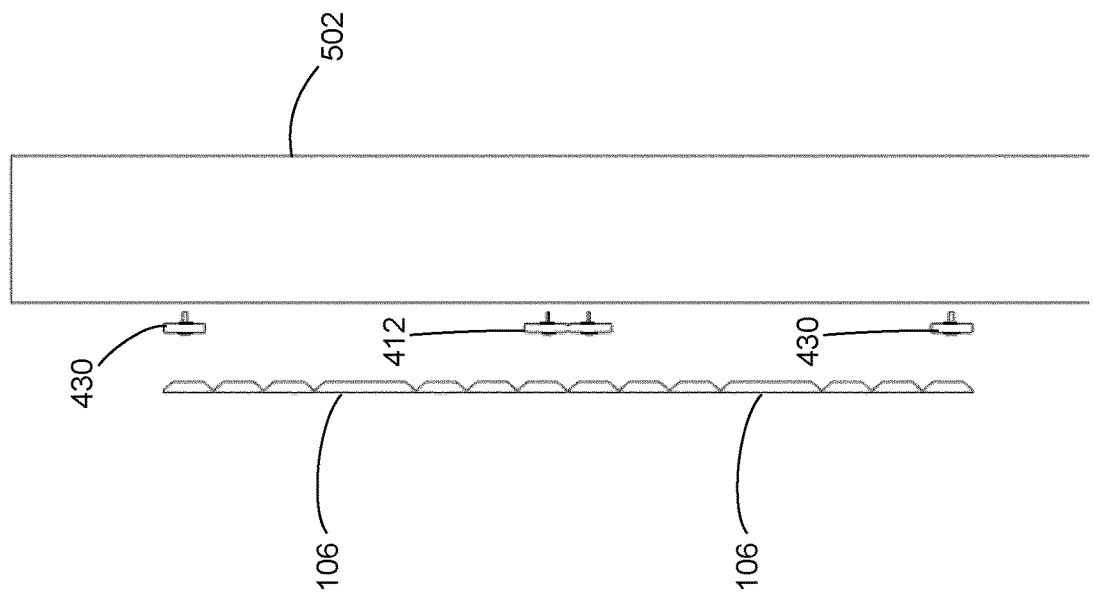
FIGS. 19A to 19C show an example of mounting four LED display modules onto a wall using a plurality of dual- and single-attachment plates.
Figure 19A:
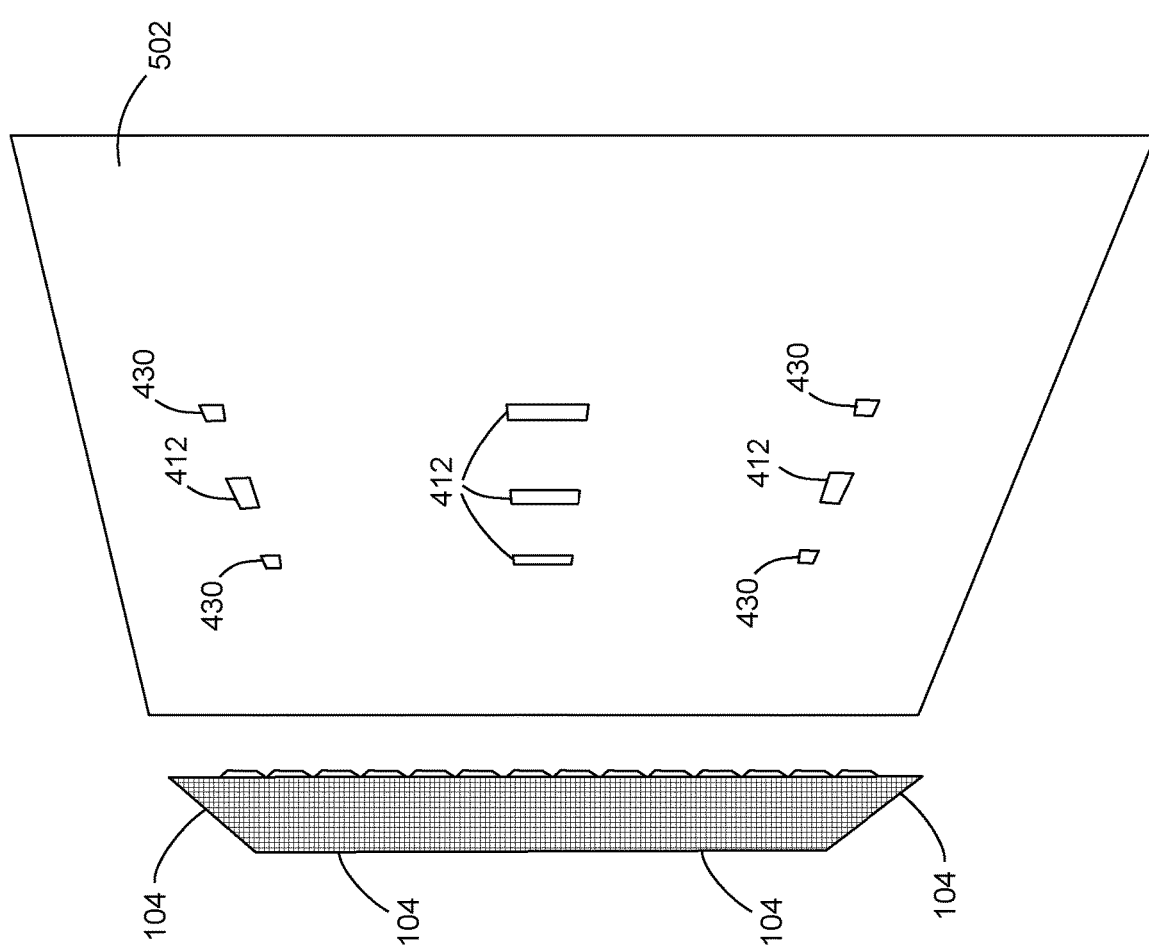
Figure 19C:
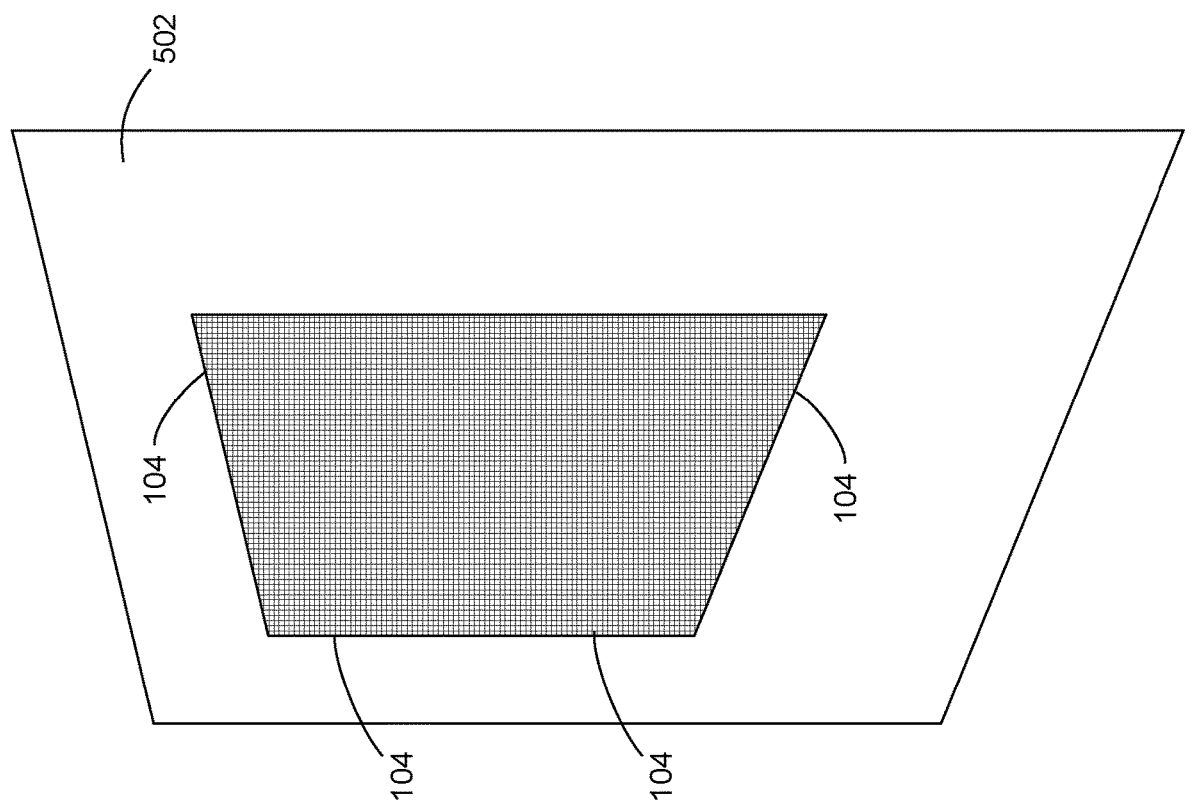

In some embodiments, one or more LED display modules 104 may be mounted onto other mounting equipment using dual-attachment and single-attachment plates 412 and 430. For example, FIGS. 19A to 19C show an example of mounting four LED display modules 104 onto a wall 502 using a plurality of dual-attachment and single-attachment plates 412 and 430.

Those skilled in the art will appreciate that the above-described electrical interconnection methods and the above-described mounting methods may also be used for interconnecting and mounting non-flexible LED display submodules and modules.

Although in above embodiments, an LED display system having an LED signage display is disclosed, in some alternative embodiments, the LED signage display may be an LED lighting apparatus, which, rather than being used for displaying images, is used for lighting purposes. Correspondingly, the LED system in these embodiments is then an LED lighting system.

Although in above embodiments, the dual-attachment plate 412 are used for electrically coupling two LED display modules 104, in some embodiments, the dual-attachment plate 412 may also be used for coupling two LED display submodules 108.

Although embodiments have been described above with reference to the accompanying drawings, those of skill in the art will appreciate that variations and modifications may be made without departing from the scope thereof as defined by the appended claims.

What is claimed is:

1. A Light-Emitting Diode (LED) display module comprising:
   a plurality of LED display submodules, each LED display submodule comprising one or more LEDs, the plurality of LED display submodules flexibly coupled to each other to form a flexible display surface; and
   a plurality of flexible electrical-connectors for interconnecting the plurality of LED display submodules, at least one of the plurality of flexible electrical-connectors comprising two halves flexibly coupled together, the two halves made of a rigid material.

2. The LED display module of claim 1, wherein at least one of the plurality of flexible electrical-connectors is removably connectable to two of the plurality of LED display submodules.

3. The LED display module of claim 1, wherein at least two of the plurality of LED display submodules each comprises a first electrically-conductive coupling structure; and wherein at least one of the plurality of flexible electrical-connectors comprises a second electrically-conductive coupling structure for electrically and mechanically engaging the first electrically-conductive coupling structure.

4. The LED display module of claim 3, wherein the first electrically-conductive coupling structure comprises a set of electrically-conductive recesses; and wherein the second electrically-conductive coupling structure comprises at least two sets of electrically-conductive extrusions, each set of extrusions electrically and mechanically engageable with the set of electrically-conductive recesses.

5. The LED display module of claim 4, wherein the set of electrically-conductive recesses and the set of electrically-conductive extrusions comprise magnets with opposite poles.

6. The LED display module of claim 1, wherein the at least one of the plurality of flexible electrical-connectors comprises at least one screw hole on each of the two halves for mounting the flexible electrical-connector to a surface.

7. The LED display module of claim 1, wherein at least one of the plurality of flexible electrical-connectors comprises a mounting structure for mounting the flexible electrical-connector to a surface.

8. The LED display module of claim 1, wherein at least one of the plurality of flexible electrical-connectors comprises a flexible Printed Circuit Board (PCB).

9. The LED display module of claim 1, wherein at least one of the plurality of flexible electrical-connectors comprises a flexible and electrically conductive strip.

10. A Light-Emitting Diode (LED) display module comprising:
    a plurality of LED display submodules, each LED display submodule comprising one or more LEDs;
    a flexible housing structure, the flexible housing structure comprising a plurality of cells for receiving the plurality of LED display submodules such that the plurality of LED display submodules are flexibly coupled to each other to form a flexible display surface; and a plurality of flexible electrical conductors embedded in the flexible housing structure.

11. The LED display module of claim 10, wherein each cell comprises a plurality of electrical terminals connected to the plurality of flexible electrical conductors and configured for electrically connection with the LED display submodule received in the cell.

12. The LED display module of claim 11, wherein the plurality of electrical terminals of each cell comprises at least a first set of electrical terminals for transmitting electrical power.

13. The LED display module of claim 12, wherein the plurality of electrical terminals of each cell further comprises at least a second set of electrical terminals for transmitting data or control signals.

14. A LED apparatus comprising:
one or more LED display modules, each LED display module comprising at least one first coupling structure and a plurality of LEDs; and
one or more sets of attachment structures for attaching the one or more LED display modules to a surface, each attachment structure comprising at least one second coupling structure for engaging the first coupling structure via magnetic force;
wherein the one or more sets of attachment structures comprises at least one first attachment structure configured for coupling two neighboring LED display modules and for attaching the two neighboring LED display modules to the surface;
wherein each first attachment structure comprises two halves flexibly coupled together; wherein each half is made of a rigid material and comprises one of the second coupling structures.

15. The LED apparatus of claim 14, wherein the at least one first coupling structure of each LED display module comprises four first coupling structures located at four corners of the LED display module.

16. The LED apparatus of claim 14, wherein the second coupling structure of each half of the first attachment structure comprises at least one magnet with a pole opposite to that of the magnets of the first coupling structure.

17. The LED apparatus of claim 14, wherein the first attachment structure is configured for electrically connecting the two neighboring LED display modules.

18. The LED apparatus of claim 14, wherein the first attachment structure comprises a flexible PCB.

19. The LED apparatus of claim 14, wherein the first attachment structure comprises a plurality of first electrical terminals for electrically connecting the two neighboring LED display modules.

20. The LED apparatus of claim 14, wherein each LED display module comprises a flexible housing structure; and
wherein the flexible housing structure comprises:
a plurality of cells for receiving a plurality of LED display submodules, each LED display submodule comprising a portion of the plurality of LEDs, and
a plurality of flexible electrical conductors embedded in the flexible housing structure.

21. The LED apparatus of claim 20, wherein each cell comprises a plurality of second electrical terminals connected to the plurality of flexible electrical conductors and configured for electrically connection with the LED display submodule received in the cell.

* * * * *